United States Patent
Wu et al.

(10) Patent No.: US 11,696,453 B2
(45) Date of Patent: Jul. 4, 2023

(54) VERTICAL METAL OXIDE SEMICONDUCTOR CHANNEL SELECTOR TRANSISTOR AND METHODS OF FORMING THE SAME

(71) Applicant: Taiwan Semiconductor Manufacturing Company Limited, Hsinchu (TW)

(72) Inventors: Yong-Jie Wu, Hsinchu (TW); Yen-Chung Ho, Hsinchu (TW); Pin-Cheng Hsu, Zhubei (TW); Mauricio Manfrini, Zhubei (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/843,118

(22) Filed: Jun. 17, 2022

(65) Prior Publication Data
US 2022/0328562 A1  Oct. 13, 2022

Related U.S. Application Data

(62) Division of application No. 16/909,109, filed on Jun. 23, 2020, now Pat. No. 11,374,057.

(51) Int. Cl.
*H10B 63/00* (2023.01)
*H01L 29/786* (2006.01)
(Continued)

(52) U.S. Cl.
CPC ....... *H10B 63/34* (2023.02); *H01L 29/66969* (2013.01); *H01L 29/7869* (2013.01); *H01L 29/78642* (2013.01); *H10B 53/30* (2023.02); *H10B 53/40* (2023.02); *H10B 63/80* (2023.02); *H10N 70/011* (2023.02); *H10N 70/231* (2023.02); *H10N 70/24* (2023.02)

(58) Field of Classification Search
None
See application file for complete search history.

(56) References Cited

U.S. PATENT DOCUMENTS 10,276,794 B1 * 4/2019 Peng ............... H01L 45/146
2011/0092030 A1   4/2011 Or-Bach et al.
(Continued)

FOREIGN PATENT DOCUMENTS

WO  WO-2018118096 A1 *  6/2018 ..... H01L 21/823412
WO      2018182730 A1   10/2018

*Primary Examiner* — Vincent Wall
(74) *Attorney, Agent, or Firm* — The Marbury Law Group, PLLC

(57) ABSTRACT

A device structure includes at least one selector device. Each selector device includes a vertical stack including, from bottom to top, a bottom electrode, a metal oxide semiconductor channel layer, and a top electrode and located over a substrate, a gate dielectric layer contacting sidewalls of the bottom electrode, the metal oxide semiconductor channel layer, and the top electrode, and a gate electrode formed within the gate dielectric layer and having a top surface that is coplanar with a top surface of the top electrode. Each top electrode or each bottom electrode of the at least one selector device may be contacted by a respective nonvolatile memory element to provide a one-selector one-resistor memory cell.

20 Claims, 17 Drawing Sheets

(51) Int. Cl.
*H01L 29/66* (2006.01)
*H10B 53/30* (2023.01)
*H10B 53/40* (2023.01)
*H10N 70/00* (2023.01)
*H10N 70/20* (2023.01)

(56) References Cited

U.S. PATENT DOCUMENTS

2011/0215396 A1    9/2011   Tang et al.
2012/0074466 A1    3/2012   Setiadi et al.
2019/0348540 A1* 11/2019   Pillarisetty .............. H01L 29/66
2019/0355726 A1   11/2019   Pillarisetty et al.

* cited by examiner

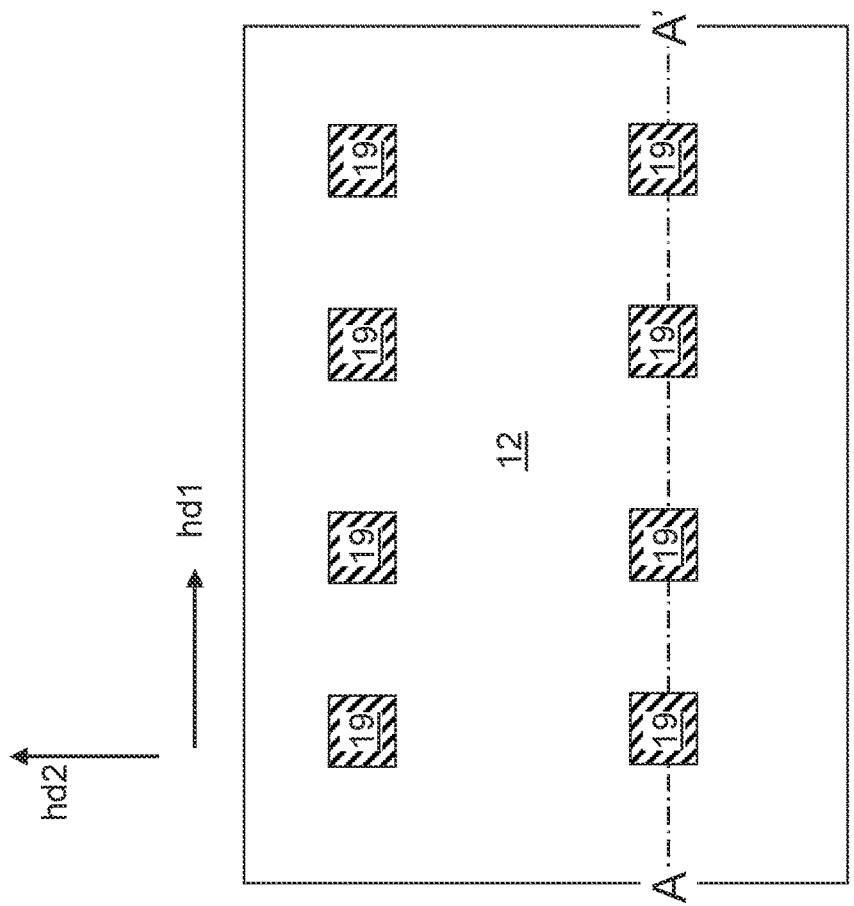
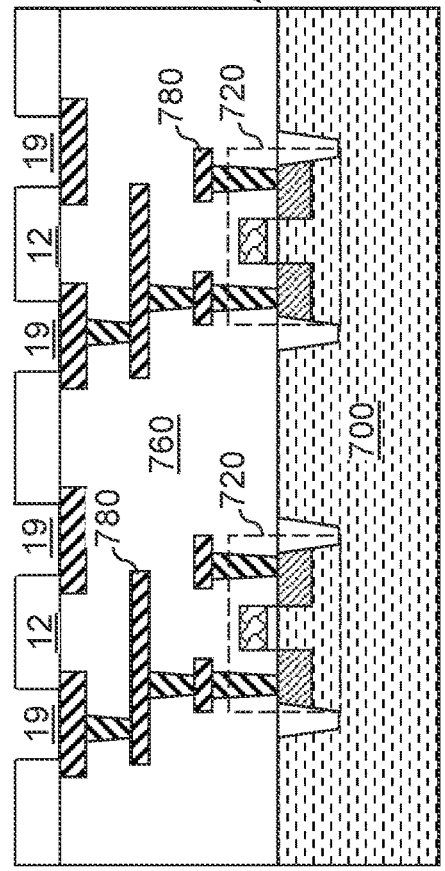
FIG. 1B
FIG. 1A

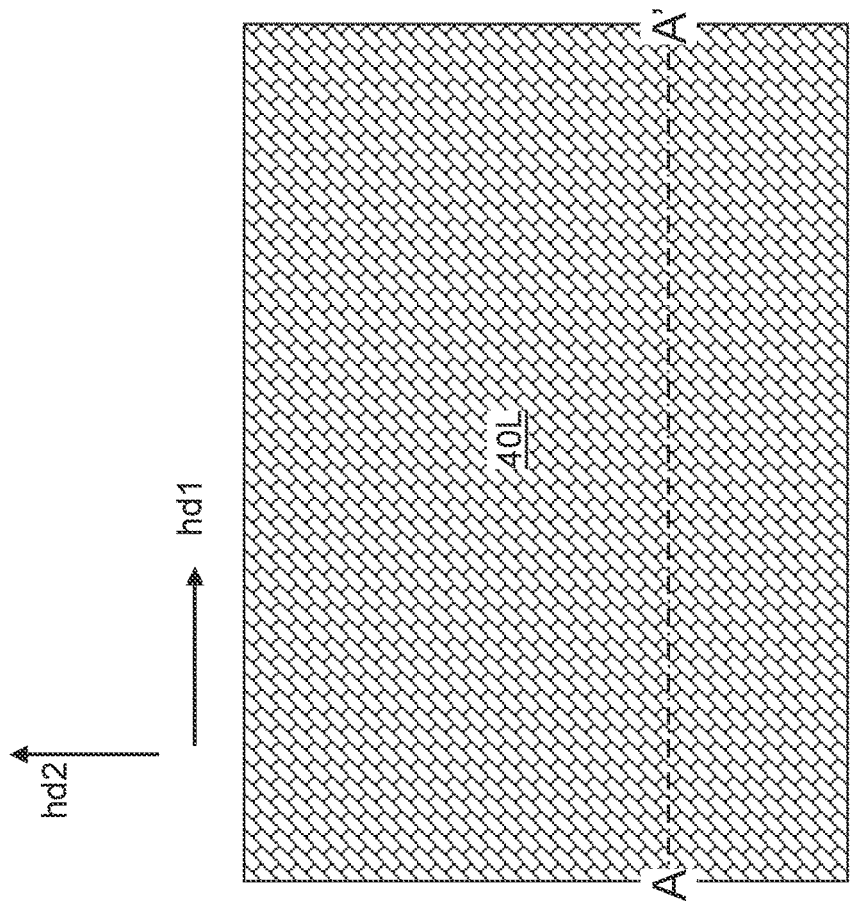
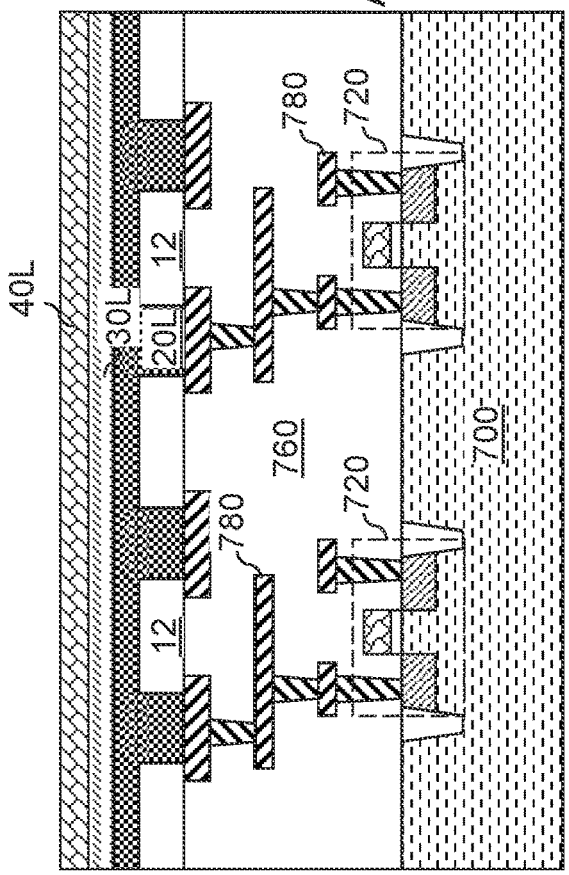
FIG. 2A
FIG. 2B

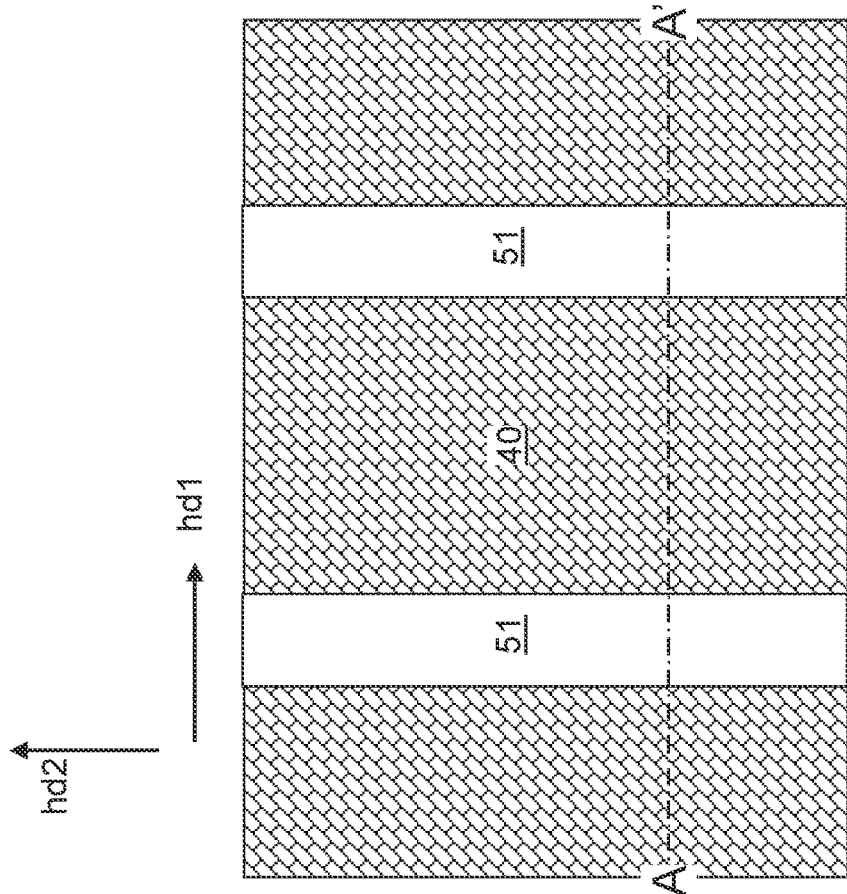
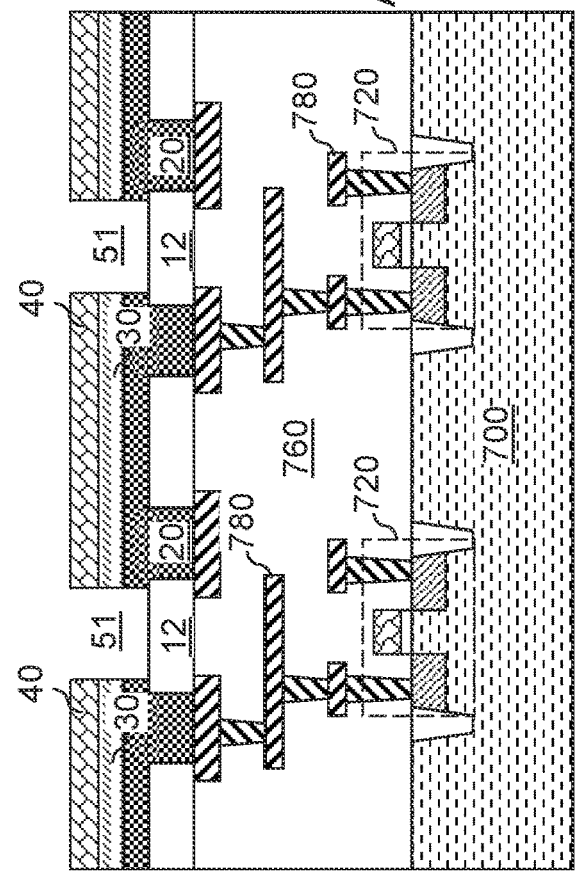
FIG. 3B
FIG. 3A

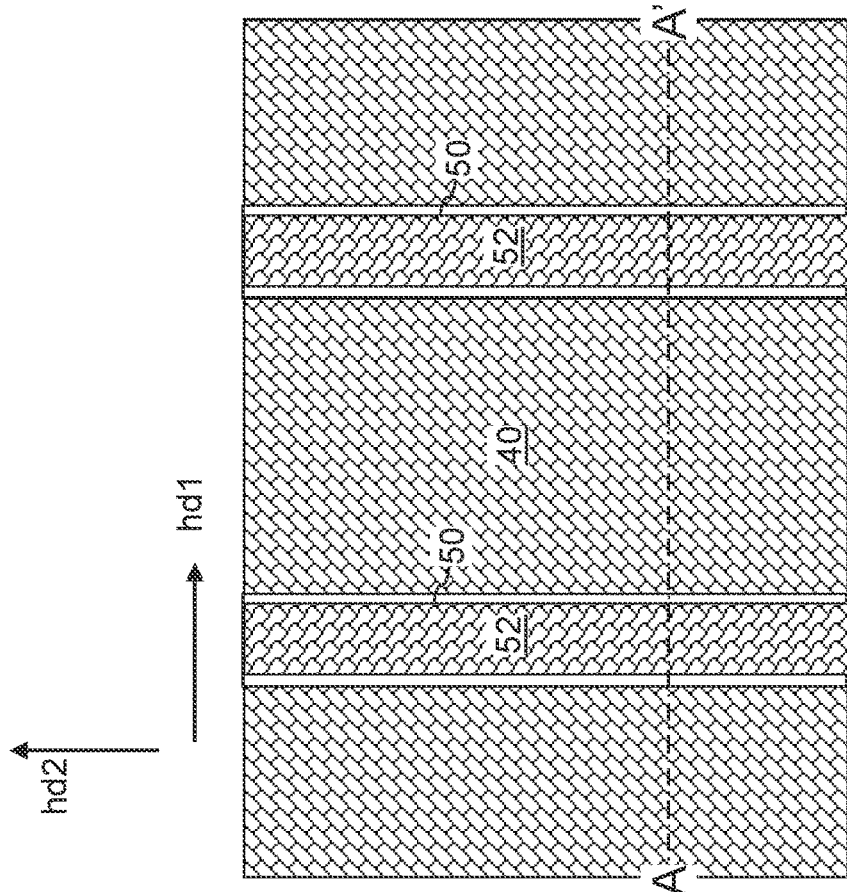
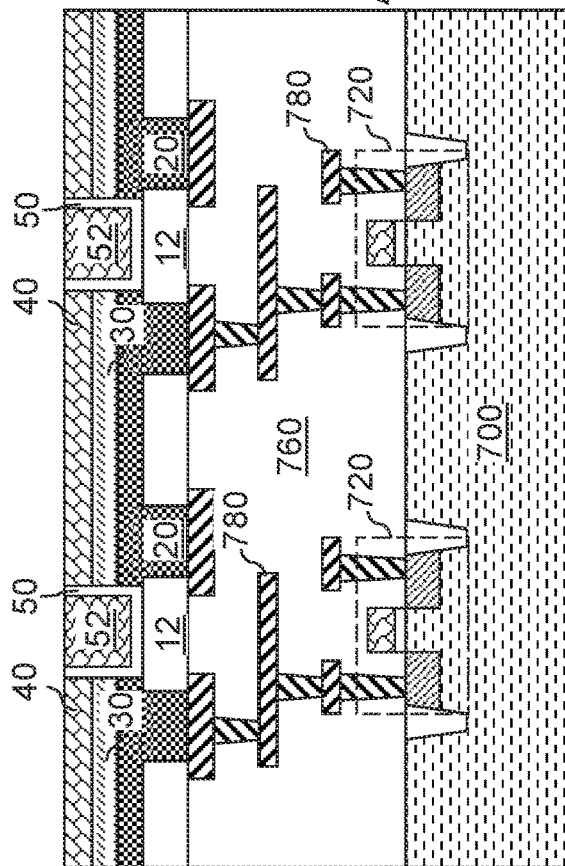
FIG. 5A
FIG. 5B

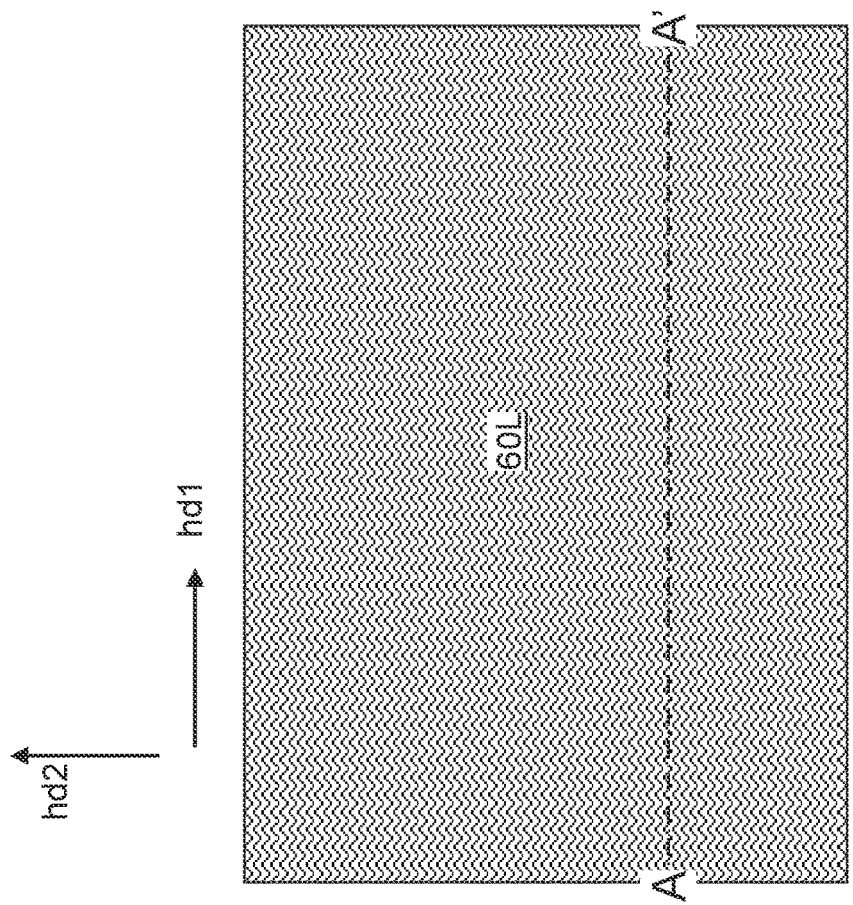
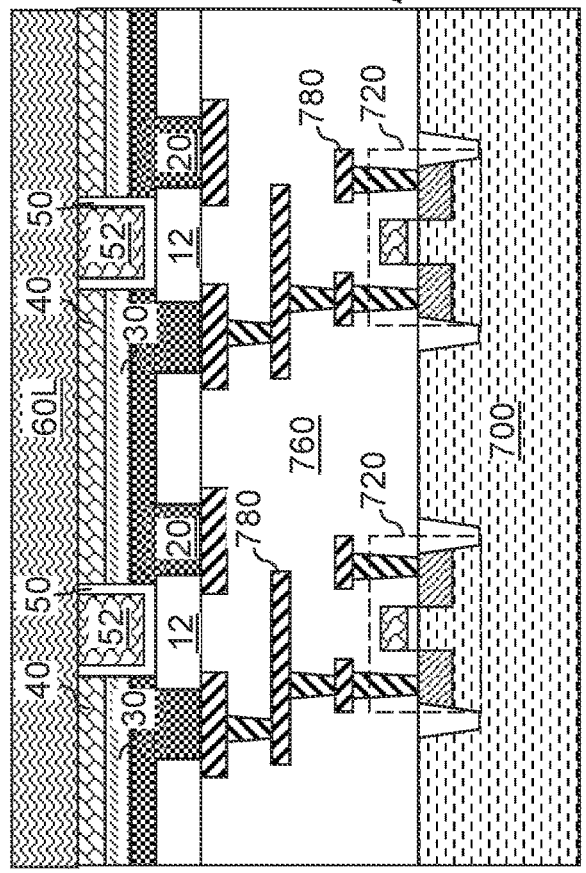
FIG. 6B
FIG. 6A

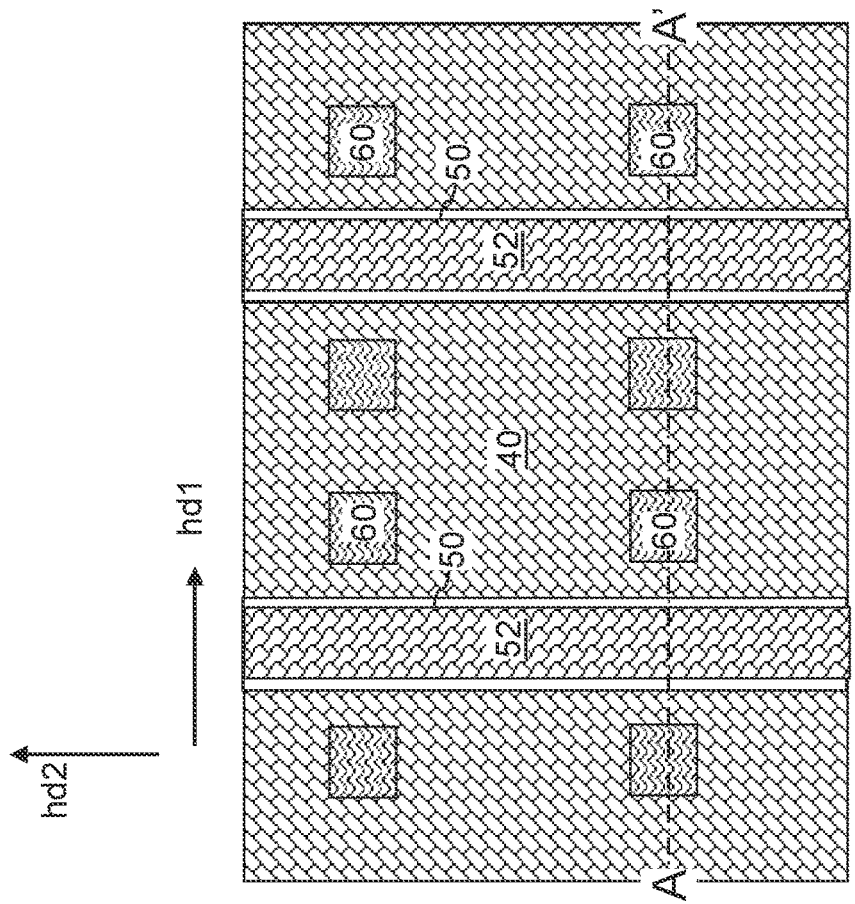
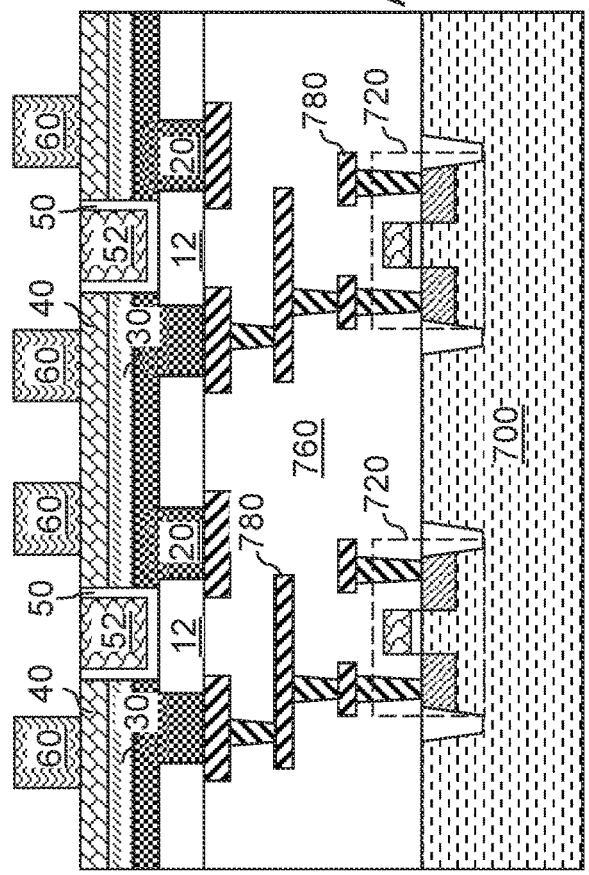
FIG. 7A
FIG. 7B

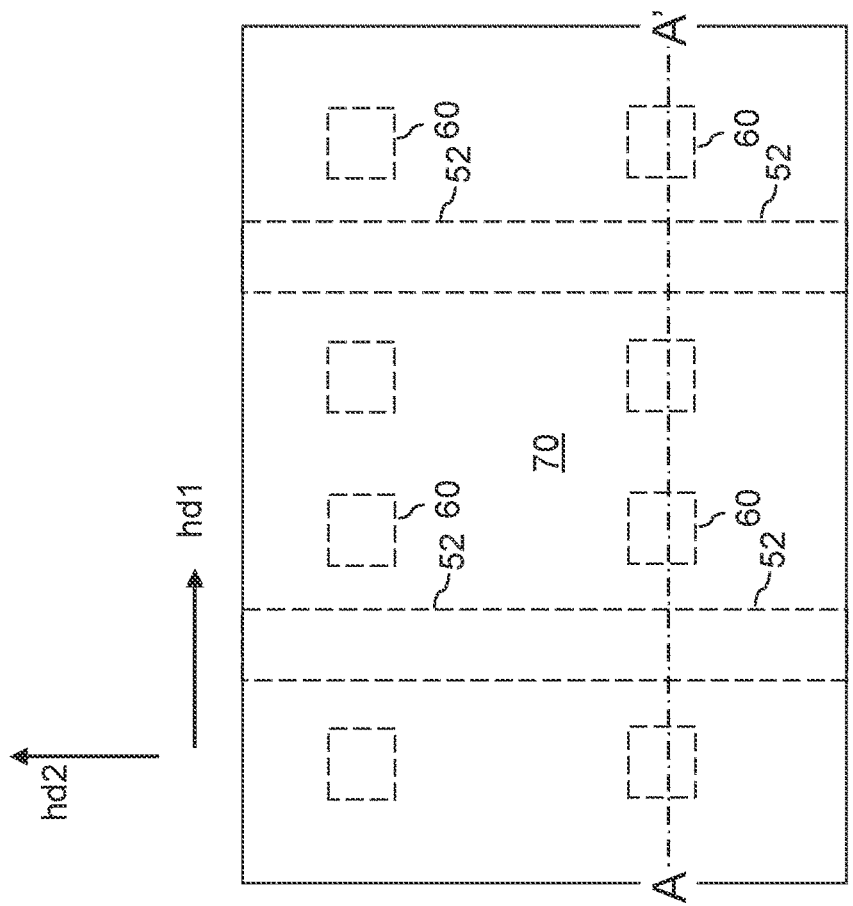
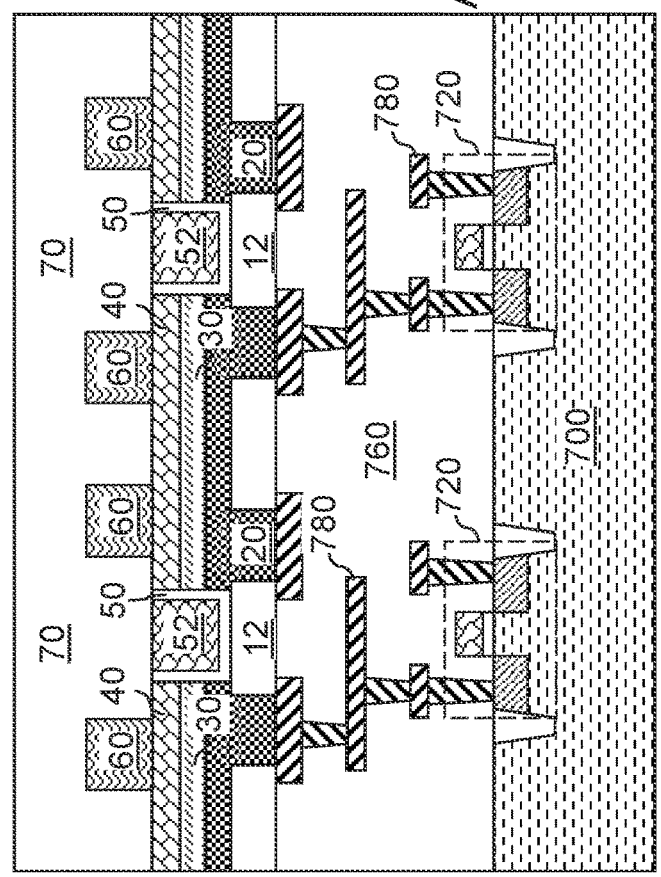
FIG. 8A
FIG. 8B

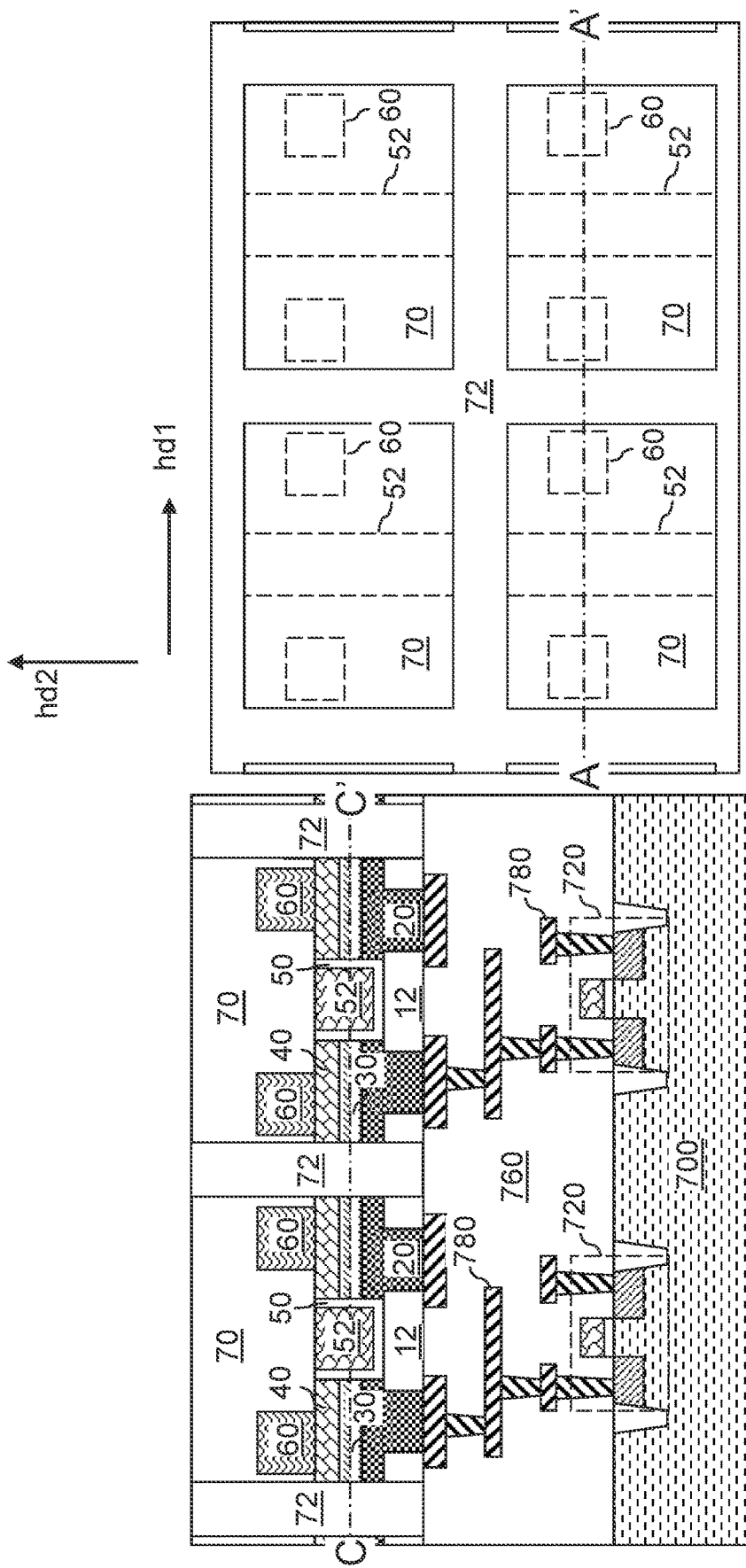

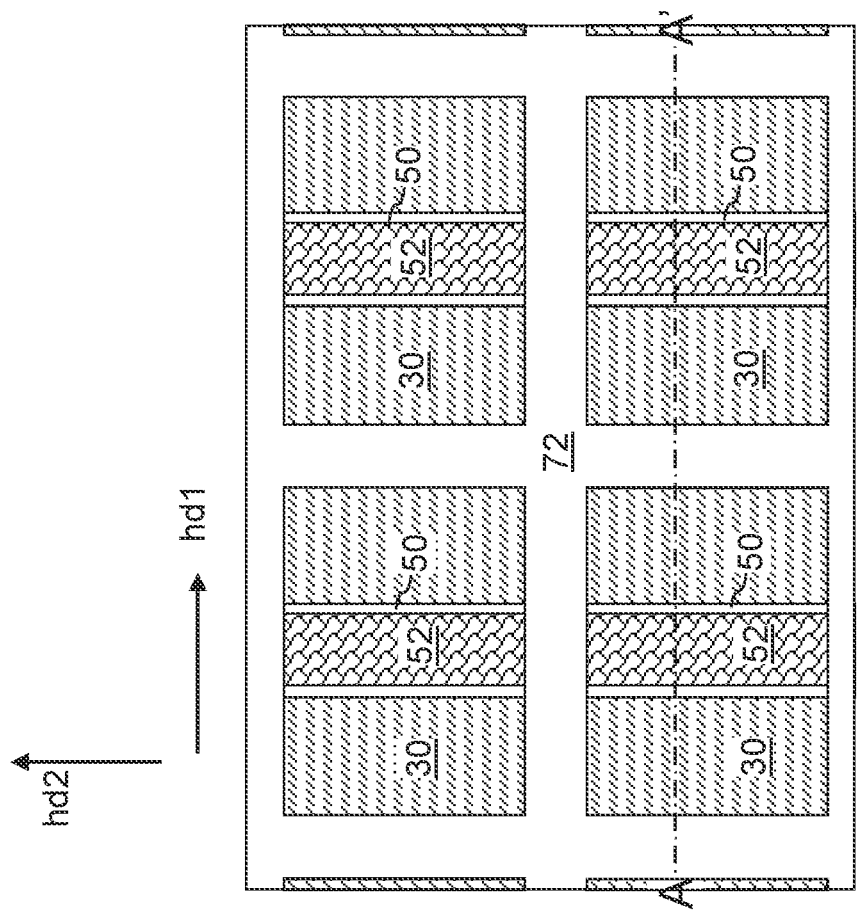

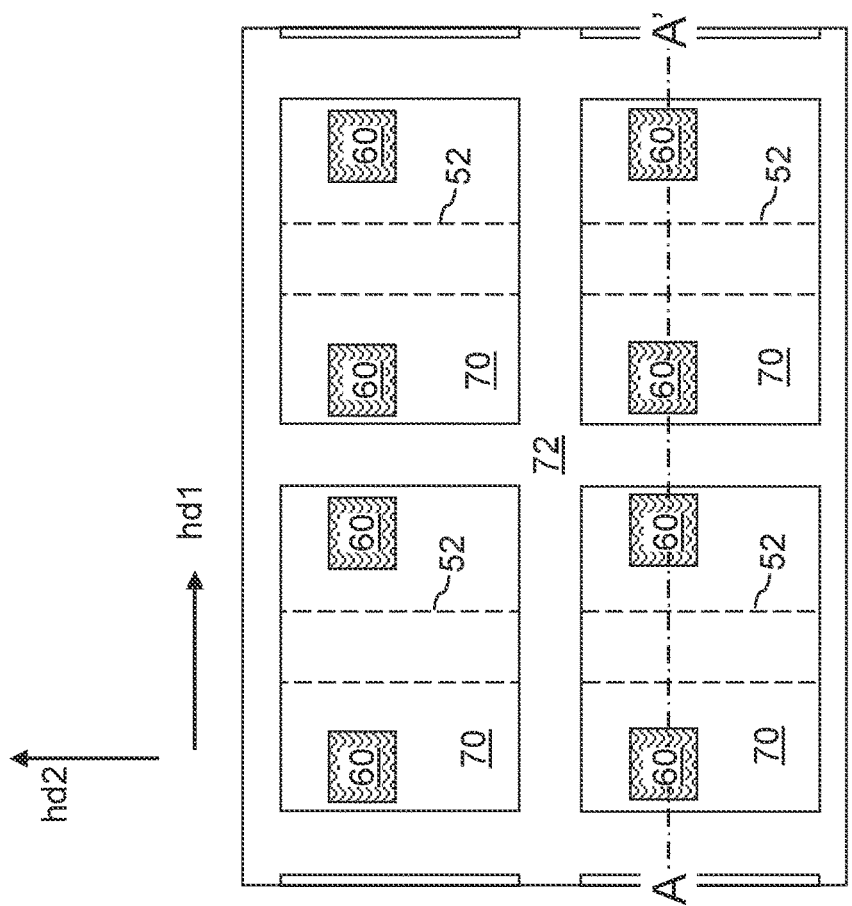
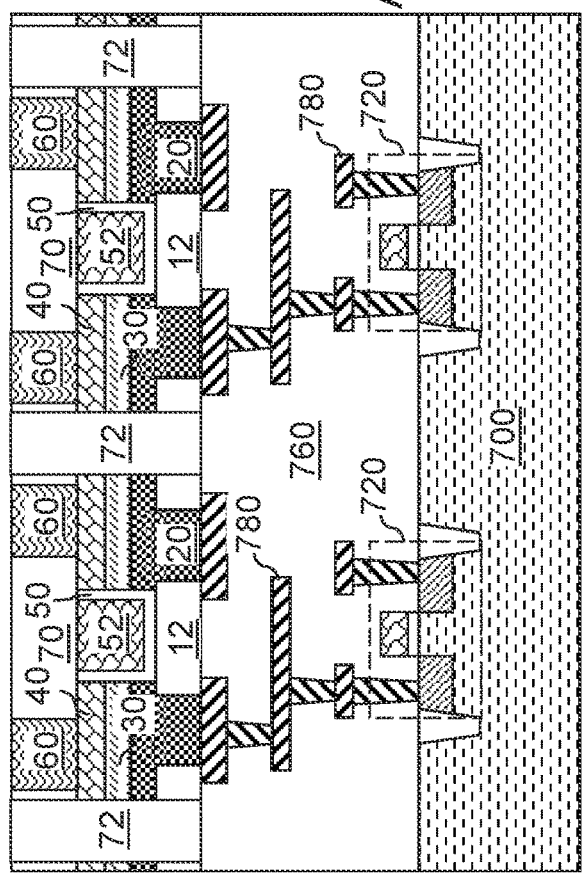
FIG. 10A
FIG. 10B

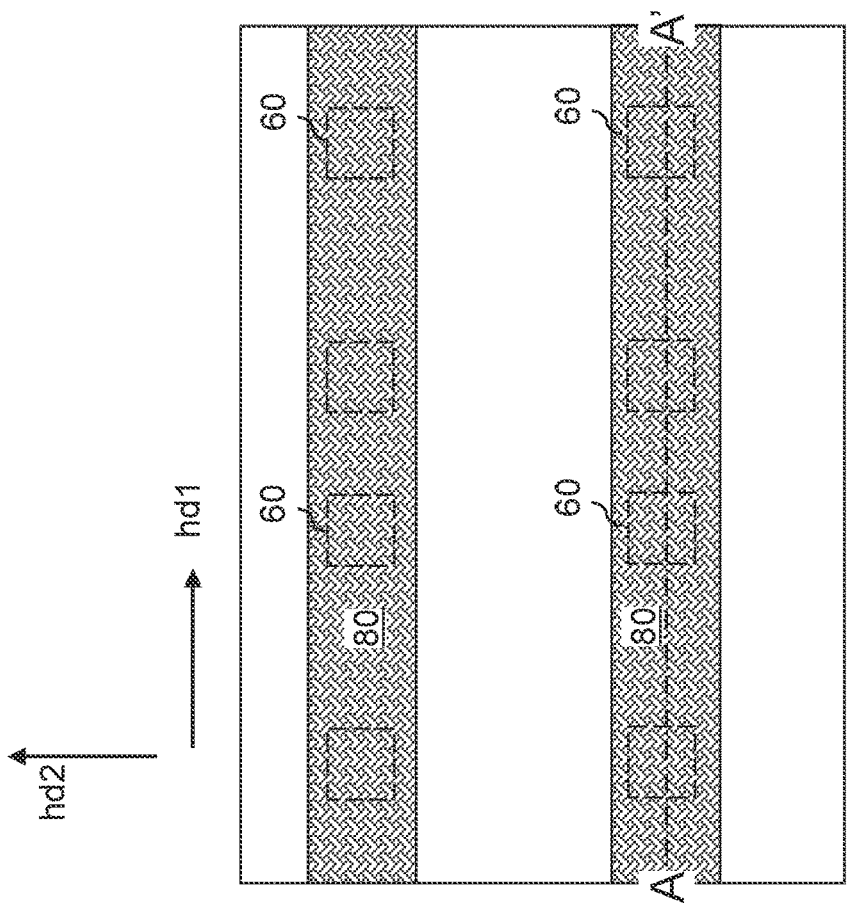
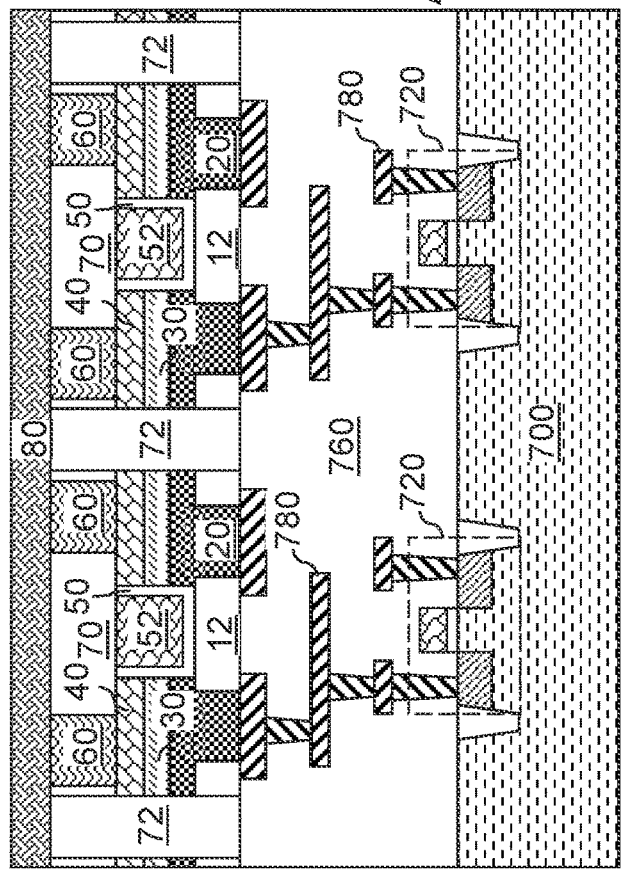
FIG. 11A
FIG. 11B

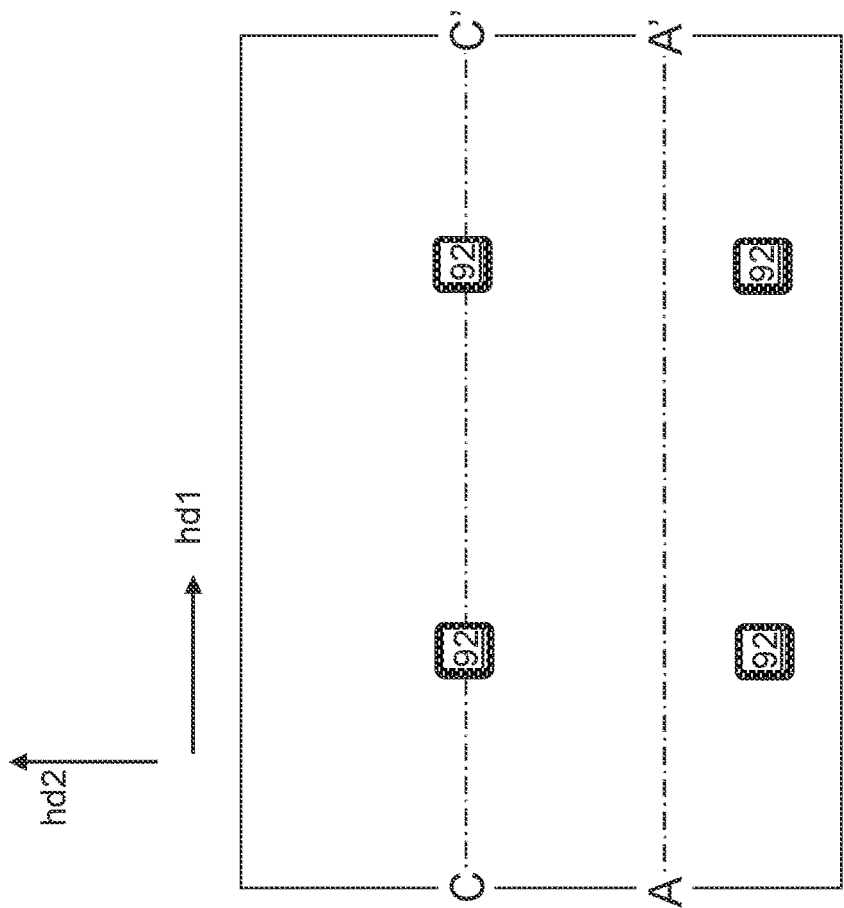
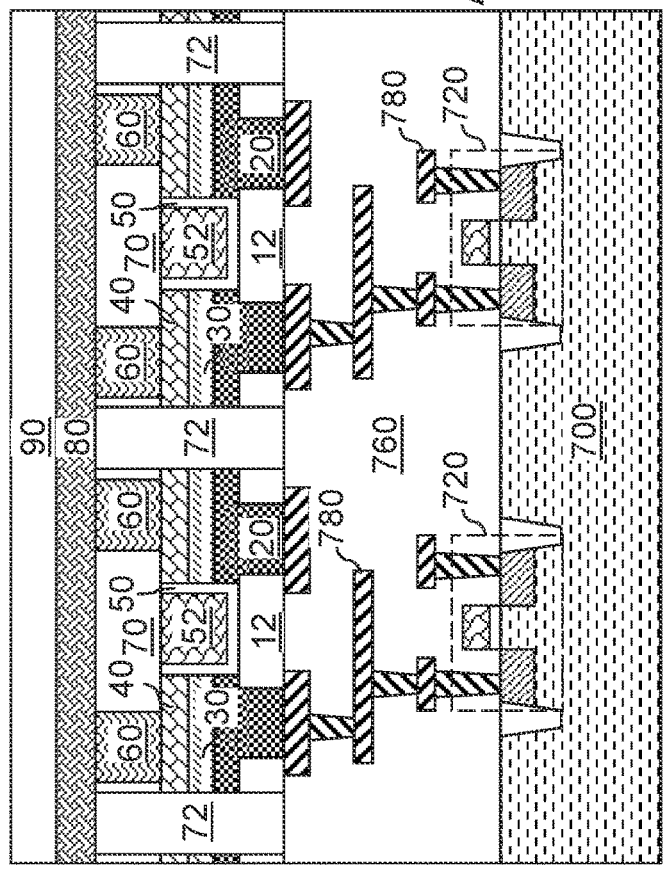
FIG. 12A
FIG. 12B

VERTICAL METAL OXIDE SEMICONDUCTOR CHANNEL SELECTOR TRANSISTOR AND METHODS OF FORMING THE SAME

RELATED APPLICATIONS

This application is a divisional application of U.S. application Ser. No. 16/909,109 filed on Jun. 23, 2020 entitled "Vertical Metal Oxide Semiconductor Channel Selector Transistor and Methods for Forming the Same", the entire contents of which are incorporated herein by reference.

BACKGROUND

Traditional selector devices such as diodes or ovonic threshold switches have many limitations in terms of device density, leakage current level, high threshold voltages, on-off ratios, and manufacturing cost. A compact low-cost selector device for an array application is thus desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of an exemplary structure after formation of dielectric material layers having formed therein metal interconnect structures and via cavities extending through a via-level dielectric material layer according to an embodiment of the present disclosure.

FIG. 1B is a top-down view of the exemplary structure of FIG. 1A. The vertical cross-sectional plane A-A' is the plane of the vertical cross-section of FIG. 1A.

FIG. 2A is a vertical cross-sectional view of an exemplary structure after formation of a bottom electrode layer, a metal oxide semiconductor channel material layer, and a top electrode layer according to an embodiment of the present disclosure.

FIG. 2B is a top-down view of the exemplary structure of FIG. 2A. The vertical cross-sectional plane A-A' is the plane of the vertical cross-section of FIG. 2A.

FIG. 3A is a vertical cross-sectional view of an exemplary structure after patterning vertical stacks of the bottom electrode layer, the metal oxide semiconductor channel material layer, and the top electrode layer according to an embodiment of the present disclosure.

FIG. 3B is a top-down view of the exemplary structure of FIG. 3A. The vertical cross-sectional plane A-A' is the plane of the vertical cross-section of FIG. 3A.

FIG. 5A is a vertical cross-sectional view of an exemplary structure after formation of gate dielectric layers and gate electrodes according to an embodiment of the present disclosure.

FIG. 5B is a top-down view of the exemplary structure of FIG. 4A. The vertical cross-sectional plane A-A' is the plane of the vertical cross-section of FIG. 5A.

FIG. 6A is a vertical cross-sectional view of an exemplary structure after formation of a nonvolatile memory material layer according to an embodiment of the present disclosure.

FIG. 6B is a top-down view of the exemplary structure of FIG. 6A. The vertical cross-sectional plane A-A' is the plane of the vertical cross-section of FIG. 6A.

FIG. 7A is a vertical cross-sectional view of an exemplary structure after formation of an array of nonvolatile memory elements according to an embodiment of the present disclosure.

FIG. 7B is a top-down view of the exemplary structure of FIG. 7A. The vertical cross-sectional plane A-A' is the plane of the vertical cross-section of FIG. 7A.

FIG. 8A is a vertical cross-sectional view of an exemplary structure after formation of a memory-level dielectric layer according to an embodiment of the present disclosure.

FIG. 8B is a top-down view of the exemplary structure of FIG. 8A. The vertical cross-sectional plane A-A' is the plane of the vertical cross-section of FIG. 8A.

FIG. 9A is a vertical cross-sectional view of an exemplary structure after formation of a dielectric isolation structure according to an embodiment of the present disclosure.

FIG. 9B is a top-down view of the exemplary structure of FIG. 9A. The vertical cross-sectional plane A-A' is the plane of the vertical cross-section of FIG. 9A.

FIG. 9C is a horizontal cross-sectional view along the horizontal plane C-C' of the exemplary structure of FIG. 9A. The vertical cross-sectional plane A-A' is the plane of the vertical cross-section of FIG. 9A.

FIG. 10A is a vertical cross-sectional view of an exemplary structure after recessing the memory-level dielectric layer and the dielectric isolation structure according to an embodiment of the present disclosure.

FIG. 10B is a top-down view of the exemplary structure of FIG. 10A. The vertical cross-sectional plane A-A' is the plane of the vertical cross-section of FIG. 10A.

FIG. 11A is a vertical cross-sectional view of an exemplary structure after formation of bit lines according to an embodiment of the present disclosure.

FIG. 11B is a top-down view of the exemplary structure of FIG. 11A. The vertical cross-sectional plane A-A' is the plane of the vertical cross-section of FIG. 11A.

FIG. 12A is a vertical cross-sectional view of an exemplary structure after formation of a contact-level dielectric layer and gate electrode contact via structures according to an embodiment of the present disclosure.

FIG. 12B is a top-down view of the exemplary structure of FIG. 12A. The vertical cross-sectional plane A-A' is the plane of the vertical cross-section of FIG. 12A.

DETAILED DESCRIPTION

Figure 4A:
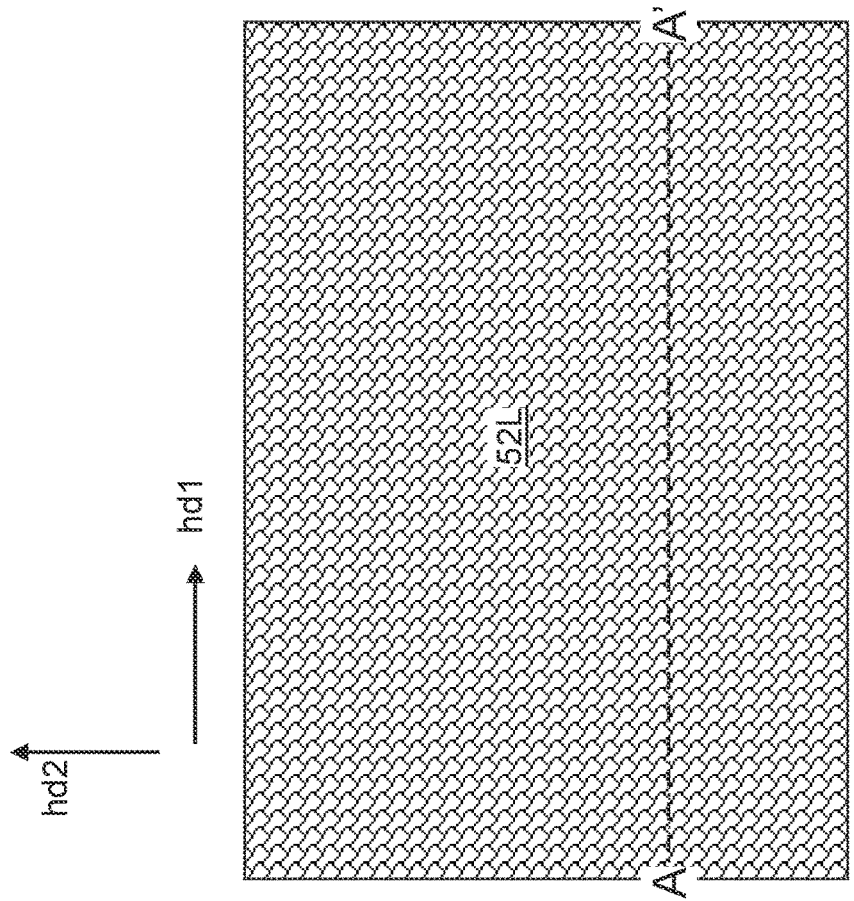
FIG. 4A is a vertical cross-sectional view of an exemplary structure after formation of a gate dielectric material layer and a gate electrode material layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to semiconductor devices including a vertical field effect transistor as a selector device for a memory cell and methods of forming the same.

A two-dimensional memory array in a cross-point array configuration uses word lines and bit lines to individually access a memory cell. Selection of a single memory cell may be achieved by selecting both a word line and a bit line. Half-selection occurs on a row of memory elements that are connected to the selected word line and not connected the selected bit line. In a similar manner, half-selection may occur on a column of memory elements that are connected to the selected bit line and not connected the selected word line. While half-selected memory elements are not activated for reading or programming, such memory elements develop significant leakage current, which may render a large two-dimensional cross-point array practically inoperable.

According to an embodiment of the present disclosure, selector elements may be introduced into a cross-point memory array to resolve the problem of leakage current from half-selected memory cells. In such an embodiment, a selector element may be connected to a memory element in a series connection. Specifically, a vertical channel field effect transistor may be used as the selector element. The vertical channel field effect transistor of the various embodiments allow electrical conduction therethrough only when the vertical channel field effect transistor is turned on through application of a gate bias voltage. Use of vertical channel field effect transistors as selector elements in a cross-point memory array may enhance signal-to-noise ratio in the cross-point memory array, enhance the operational window of the cross-point memory array, and/or provide a larger size cross-point memory array including more memory elements. The various aspects of embodiments of the present disclosure are described in detail herebelow.

FIG. 1A is a vertical cross-sectional view of an exemplary structure after formation of dielectric material layers having formed therein metal interconnect structures and via cavities extending through a via-level dielectric material layer according to an embodiment of the present disclosure. FIG. 1B is a top-down view of the exemplary structure of FIG. 1A. The vertical cross-sectional plane A-A' is the plane of the vertical cross-section of FIG. 1A. Referring to FIGS. 1A and 1B, an exemplary structure according to an embodiment of the present disclosure is illustrated. The exemplary structure includes a substrate 700, which may be a semiconductor substrate such as a silicon wafer. In embodiments in which the substrate 700 is a semiconductor substrate, semiconductor devices 720 such as field effect transistors may be formed on a top surface of the substrate 700. In one embodiment, the semiconductor devices 720 may include a logic circuit for controlling operation of a two-dimensional memory array to be subsequently formed. In an illustrative example, the two-dimensional memory array may include a two-dimensional array of nonvolatile memory elements, and the field effect transistors selected from the semiconductor devices 720 may comprise a programming circuit and a sensing circuit for the array of nonvolatile memory elements.

Dielectric material layers 760 having formed therein metal interconnect structures 780 may be formed over the field effect transistors. The metal interconnect structures 780 may be connected to electrical nodes of the semiconductor devices 720, such as field effect transistors. A subset of the metal interconnect structures 780 may electrically connect a respective node of the field effect transistors to a respective node of the two-dimensional memory array to be subsequently formed. In one embodiment, the subset of the metal interconnect structures 780 may be electrically connected to electrical nodes of the field effect transistors and may be subsequently electrically connected to bottom electrodes or top electrodes of an array of selector devices to be subsequently formed. In one embodiment, a subset of the metal interconnect structures 780 located at the topmost level of the metal interconnect structures 780 may include word lines to be subsequently connected to bottom electrodes of selector devices to be subsequently formed.

In one embodiment, a via-level dielectric layer 12 may be formed above the dielectric material layers 760. The via-level dielectric layer 12 includes an interlayer dielectric (ILD) material such as undoped silicate glass, a doped silicate glass, organosilicate glass, or a porous dielectric material. Other suitable materials for use as the ILD are within the contemplated scope of disclosure. The thickness of the via-level dielectric layer 12 may be in a range from 60 nm to 600 nm, such as from 120 nm to 300 nm, although lesser and greater thicknesses may also be used. The via-level dielectric layer 12 may be formed by a conformal or non-conformal deposition process such as chemical vapor deposition or spin-coating.

A photoresist layer (not shown) may be applied over the via-level dielectric layer 12, and may be lithographically patterned to form discrete openings therethrough. In one embodiment, the discrete openings through the photoresist layer may be formed as a two-dimensional periodic array of discrete openings that may be repeated along a first horizontal direction hd1 with a first periodicity and along a second horizontal direction hd2 with a second periodicity. The first periodicity may be the same as the pitch of word lines (which may be a subset of the metal interconnect structures 780 located at a topmost level of the metal interconnect structures 780). The second periodicity may be the same as the pitch of bit lines to be subsequently formed. The first pitch may be in a range from 30 nm to 1,000 nm, such as from 60 nm to 500 nm, although lesser and greater dimensions may also be used. The second pitch may be in a range from 30 nm to 1,000 nm, such as from 60 nm to 500 nm, although lesser and greater dimensions may also be used.

An anisotropic etch process may be performed to transfer the pattern of the openings in the photoresist layer through the via-level dielectric layer 12. Via cavities may be formed through the via-level dielectric layer 12. The via cavities are herein referred to as bottom-electrode-level via cavities 19. Top surfaces of underlying metal interconnect structures 780 (which may be top surfaces of word lines) may be physically exposed at the bottom of the bottom-electrode-level via cavities 19. The lateral dimension of each bottom-electrode-level via cavity 19 along the first horizontal direction hd1 and/or along the second horizontal direction hd2 may be in a range from 15 nm to 500 nm, such as from 30 nm to 250 nm, although lesser and greater dimensions may also be used. Each bottom-electrode-level via cavity 19 may have a circular or elliptical horizontal cross-sectional shape, a rectangular horizontal cross-sectional shape, a horizontal cross-sectional shape of a rounded rectangle, or a horizontal cross-sectional shape of any general non-intersecting closed two-dimensional curvilinear shape. The photoresist layer may be subsequently removed, for example, by ashing.

FIG. 2A is a vertical cross-sectional view of an exemplary structure after formation of a bottom electrode layer, a metal oxide semiconductor channel material layer, and a top electrode layer according to an embodiment of the present disclosure. FIG. 2B is a top-down view of the exemplary structure of FIG. 2A. The vertical cross-sectional plane A-A' is the plane of the vertical cross-section of FIG. 2A. Referring to FIGS. 2A and 2B, a bottom electrode layer 20L, a metal oxide semiconductor channel material layer 30L, and a top electrode layer 40L may be sequentially deposited to form a vertical stack of selector component layers (20L, 30L, 40L). The bottom electrode layer 20L includes a first metallic electrode material, which may be a conductive metallic nitride material, an elemental metal, or an intermetallic alloy. For example, the bottom electrode layer 20L may include TiN, TaN, WN, W, Ti, Co, Mo, Ru, and/or combinations or alloys of the same. Other suitable materials for use as the bottom electrode layer 20L are within the contemplated scope of disclosure. The thickness of the bottom electrode layer 20L may be selected such that the entire volume of each bottom-electrode-level via cavity 19 is filled with the material of the bottom electrode layer 20L. Optionally, the horizontally-extending portion of the bottom electrode layer 20L overlying the top surface of the via-level dielectric layer 12 may be thinned as needed. The thickness of the bottom electrode layer 20L as measured above a horizontal top surface of the via-level dielectric layer 12 may be in a range from 10 nm to 250 nm, such as from 20 nm to 120 nm, although lesser and greater thickness may also be used. The bottom electrode layer 20L may be formed by chemical vapor deposition, physical vapor deposition, electroplating, or a combination thereof. The bottom electrode layer 20L may include a horizontally-extending portion that is located above the horizontal plane including the top surface of the via-level dielectric layer 12, and a two-dimensional array of via portions that are formed within the via-level dielectric layer 12.

The metal oxide semiconductor channel material layer 30L includes a metal oxide semiconductor material such as indium gallium zinc oxide (IGZO), doped zinc oxide, doped indium oxide, or doped cadmium oxide. Other suitable materials for use as the metal oxide semiconductor channel material layer 30L are within the contemplated scope of disclosure. The dopant level in the metal oxide semiconductor channel material layer 30L may be selected such that leakage current through the metal oxide semiconductor channel material layer 30L during device operation is negligible. For example, the dopant level in the metal oxide semiconductor channel material layer 30L may be in a range from $1.0 \times 10^{10}/cm^3$ to $2.0 \times 10^{16}/cm^3$, although lesser and greater dopant concentrations may also be used.

Use of a metal oxide semiconductor material instead of an elemental semiconductor material or a III-V compound semiconductor material in the metal oxide semiconductor channel material layer 30L provides the advantage of suppressing leakage current to negligible levels, thereby enhancing the effectiveness of a selector device to be subsequently formed. Metal oxide semiconductor materials may provide an on-off ratio greater than $1.0 \times 10^9$. In other words, the ratio of the on-current to off-current may be greater than $1.0 \times 10^9$ for a field effect transistor using a metal oxide semiconductor material as a channel material. In contrast, channels composed of elemental semiconductor materials and III-V compound semiconductor materials provide an on-off ratio of about $1.0 \times 10^4$. Thus, use of a metal oxide semiconductor material as a channel material provides the benefit of low leakage current, and enhanced the effectiveness of the selector device of the present disclosure.

The top electrode layer 40L includes a second metallic electrode material, which may be a conductive metallic nitride material, an elemental metal, or an intermetallic alloy. Any material that may be used for the bottom electrode layer 20L may be used for the top electrode layer 40L. The thickness of the top electrode layer 40L may be in a range from 10 nm to 250 nm, such as from 20 nm to 120 nm, although lesser and greater thicknesses may also be used. The top electrode layer 40L may be formed by chemical vapor deposition, physical vapor deposition, electroplating, or a combination thereof.

FIG. 3A is a vertical cross-sectional view of an exemplary structure after patterning vertical stacks of the bottom electrode layer, the metal oxide semiconductor channel material layer, and the top electrode layer according to an embodiment of the present disclosure. FIG. 3B is a top-down view of the exemplary structure of FIG. 3A. The vertical cross-sectional plane A-A' is the plane of the vertical cross-section of FIG. 3A. Referring to FIGS. 3A and 3B, a photoresist layer (not shown) may be applied over the top electrode layer 40L, and may be lithographically patterned to form openings therethrough. In one embodiment, the pattern of the openings in the photoresist layer may be line-shaped openings that laterally extend along the second horizontal direction hd2, and having a periodic pitch along the first horizontal direction that is twice the pitch of the array of via portions of the bottom electrode layer 20L along the first horizontal direction hd1. In other words, a pair of via portions of the bottom electrode layer 20L may be arranged along the first horizontal direction hd1 between each neighboring pair of line-shaped openings through the photoresist layer.

An anisotropic etch may be performed to transfer the pattern of the line-shaped openings in the photoresist layer through the layer stack of the top electrode layer 40L, the metal oxide semiconductor channel material layer 30L, and the bottom electrode layer 20L. Trenches may be etched through the layer stack of the top electrode layer 40L, the metal oxide semiconductor channel material layer 30L, and the bottom electrode layer 20L. In one embodiment, the trenches may include line trenches 51 having a respective uniform width. For example, line trenches 51 laterally extending along the second horizontal direction hd2 and laterally spaced apart from one another along the first horizontal direction hd1 may be formed through the layer stack of the top electrode layer 40L, the metal oxide semiconductor channel material layer 30L, and the bottom electrode layer 20L. The photoresist layer may be subsequently removed, for example, by ashing.

Each patterned portion of the bottom electrode layer 20L comprises a bottom electrode 20. Each patterned portion of the metal oxide semiconductor channel material layer 30L comprises a metal oxide semiconductor channel layer 30. Each patterned portion of the top electrode layer 40L comprises a top electrode 40. A vertical stack of a bottom electrode 20, a metal oxide semiconductor channel layer 30, and a top electrode 40 may be formed between each neighboring pair of line trenches 51. Each line trench 51 may have a uniform width, which may be in a range from 15 nm to 500 nm, such as from 30 nm to 250 nm, although lesser and greater widths may also be used. Each vertical stack of a bottom electrode 20, a metal oxide semiconductor channel layer 30, and a top electrode 40 may have a uniform width along the first horizontal direction hd1, which may be in a rage from 45 nm to 1,500 nm, such as from 90 nm to 750 nm, although lesser and greater widths may also be used.

Generally, at least one vertical stack of a bottom electrode 20, a metal oxide semiconductor channel layer 30, and a top electrode 40 may be deposited over the substrate 700. In one embodiment, a row of vertical stacks may be deposited over the substrate 700 such that the vertical stacks are arranged along the first horizontal direction hd1, and are laterally separated from one another along the first horizontal direction hd1 by line trenches 51 that laterally extend along the second horizontal direction hd2. In one embodiment, each bottom electrode 20 comprises a plate portion that overlies the via-level dielectric layer 12 and at least one via portion formed within the via-level dielectric layer 12 and adjoined to the plate portion. The plate portion of each bottom electrode 20 comprises a horizontally-extending portion of the respective bottom electrode 20 having a uniform thickness.

Figure 4B:
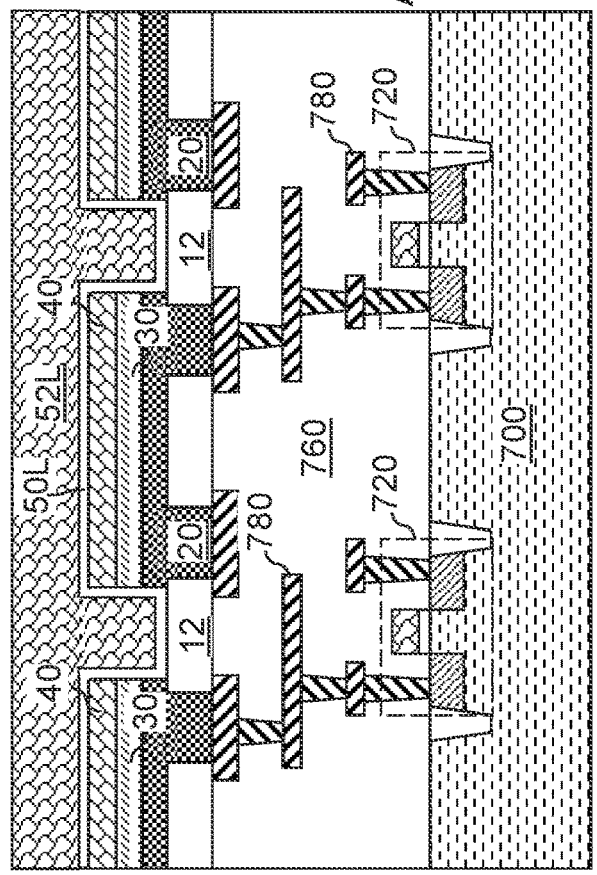
FIG. 4B is a top-down view of the exemplary structure of FIG. 4A. The vertical cross-sectional plane A-A' is the plane of the vertical cross-section of FIG. 4A.

FIG. 4A is a vertical cross-sectional view of an exemplary structure after formation of a gate dielectric material layer and a gate electrode material layer according to an embodiment of the present disclosure. FIG. 4B is a top-down view of the exemplary structure of FIG. 4A. The vertical cross-sectional plane A-A' is the plane of the vertical cross-section of FIG. 4A. Referring to FIGS. 4A and 4B, a gate dielectric material layer 50L may be formed on the physically exposed surfaces of the vertical stacks of a bottom electrode 20, a metal oxide semiconductor channel layer 30, and a top electrode 40 by a conformal deposition process. The gate dielectric material layer 50L includes a gate dielectric material such as silicon oxide, silicon oxynitride, a dielectric metal oxide, or a stack thereof. Other suitable materials for use as the gate dielectric material layer 50L are within the contemplated scope of disclosure. The gate dielectric material layer 50L may be formed by at least one conformal deposition process such as at least one chemical vapor deposition process. The thickness of the gate dielectric material layer 50L may be in a range from 1 nm to 12 m, such as from 2 nm to 6 nm, although lesser and greater thicknesses may also be used.

A gate electrode material layer 52L may be formed over the gate dielectric material layer 50L. The gate electrode material layer 52L may include a doped semiconductor material or a metallic material. Doped semiconductor materials that may be used for the gate electrode material layer 52L include doped polysilicon, a silicon-germanium alloy, or a doped III-V compound semiconductor material. The doped semiconductor material may include dopants at a dopant concentration in a range from $1.0 \times 10^{19}/cm^3$ to $2.0 \times 10^{21}/cm^3$, although lesser and greater dopant concentrations may also be used. The dopant may be p-type or n-type. Metallic materials that may be used for the gate electrode material layer 52L include conductive metallic nitride materials (such as TiN, TaN, and WN), elemental metals (such as W, Ta, Ru, Co, or Mo), and intermetallic alloy of at least two metals. Other suitable materials for use as the gate electrode material layer 52L are within the contemplated scope of disclosure. The thickness of the gate electrode material layer 52L may be in a range from 50 nm to 300 nm, although lesser and greater thicknesses may also be used.

FIG. 5A is a vertical cross-sectional view of an exemplary structure after formation of gate dielectric layers and gate electrodes according to an embodiment of the present disclosure. FIG. 5B is a top-down view of the exemplary structure of FIG. 4A. The vertical cross-sectional plane A-A' is the plane of the vertical cross-section of FIG. 5A. Referring to FIGS. 5A and 5B, portions of the gate dielectric material layer 50L and the gate electrode material layer 52L may be removed from above the horizontal plane including a top surface of the vertical stacks of a respective bottom electrode 20, the respective metal oxide semiconductor channel layer 30, and the respective top electrode 40. For example, a chemical mechanical planarization (CMP) process may be performed to remove excess portions of the gate dielectric material layer 50L and the gate electrode material layer 52L from above the horizontal plane including the top surfaces of the top electrodes 40. In one embodiment, the horizontally-extending portions of the gate dielectric material layer 50L may be used as a planarization stopping layer, and may be subsequently removed selective to the material of the top electrodes 40.

Each remaining portions of the gate dielectric material layer 50L in the line trenches 51 comprises a gate dielectric layer 50. Each remaining portion of the gate electrode material layer 52L in the line trenches 51 (as shown in FIGS. 3A and 3B) comprises a gate electrode 52. Each stack of a gate dielectric layer 50 and a gate electrode 52 comprises a gate structure (50, 52). In one embodiment, each gate structure (50, 52) may laterally contact a respective pair of vertical stacks of a respective bottom electrode 20, a respective metal oxide semiconductor channel layer 30, and a respective top electrode 40. In one embodiment, each gate dielectric layer 50 may contact sidewalls of a pair of bottom electrodes 20, sidewalls of a pair of metal oxide semiconductor channel layers, and sidewalls of a pair of top electrodes 40. In one embodiment, the gate electrodes 52 may include, and/or may consist essentially of, at least one metallic material. In this embodiment, the gate electrodes 52 may be metallic gate electrodes. In one embodiment, each gate electrode 52 may be formed within a respective gate dielectric layer 50, and may have a horizontal top surface that is coplanar with the top surfaces of the top electrodes 40.

In one embodiment, each gate dielectric layer 50 may comprise a horizontal portion contacting a bottom surface of a gate electrode 52, and a pair of vertically extending portions adjoined to a periphery of the horizontal portion. One of the pair of vertically extending portions may contact the sidewalls of a bottom electrode 20, a metal oxide semiconductor channel layer 30, and a top electrode 40 located on one side of the gate dielectric layer 50, and another of the pair of vertically extending portions may contact the sidewalls of a bottom electrode 20, a metal oxide semiconductor channel layer 30, and a top electrode 40 located on another side of the gate dielectric layer 50.

FIG. 6A is a vertical cross-sectional view of an exemplary structure after formation of a nonvolatile memory material layer according to an embodiment of the present disclosure. FIG. 6B is a top-down view of the exemplary structure of FIG. 6A. The vertical cross-sectional plane A-A' is the plane of the vertical cross-section of FIG. 6A. Referring to FIGS. 6A and 6B, a nonvolatile memory material layer 60L may be deposited over the top electrodes 40 and the gate electrodes 52. The nonvolatile memory material layer 60L includes a nonvolatile memory material, i.e., a memory material that may store information in a permanent manner or in a semi-permanent manner. For example, the nonvolatile memory material layer 60L may include a phase change material, a vacancy modulated conductive oxide material, or a ferroelectric memory material. Exemplary phase change materials include chalcogenide glass materials such as alloys of gallium, antimony, and tellurium. Other suitable materials for use as the nonvolatile memory material layer 60L are within the contemplated scope of disclosure. An exemplary vacancy modulated conductive oxide material is vacancy-rich titanium oxide, which is non-stoichiometric titanium including oxygen vacancies. Exemplary ferroelectric memory materials include hafnium oxide (such as hafnium oxide containing at least one dopant selected from Al, Zr, and Si and having a ferroelectric non-centrosymmetric orthorhombic phase), zirconium oxide, hafnium-zirconium oxide, bismuth ferrite, barium titanate (such as $BaTiO_3$; BT), and lead zirconate titanate (such as Pb (Zr, Ti) $O_3$; PZT). The nonvolatile memory material layer 60L may be deposited by any suitable deposition method such as chemical vapor deposition or physical vapor deposition. The thickness of the nonvolatile memory material layer 60L may be in a range from 3 nm to 100 nm, such as from 6 nm to 50 nm, depending on the type of the nonvolatile memory material, although lesser and greater thicknesses may also be used. In one embodiment, a sacrificial stopping layer (not shown) may be optionally deposited over nonvolatile memory material layer 60L, which may be subsequently used as an etch stop layer or as a planarization stopping layer for a chemical mechanical planarization process.

FIG. 7A is a vertical cross-sectional view of an exemplary structure after formation of an array of nonvolatile memory elements according to an embodiment of the present disclosure. FIG. 7B is a top-down view of the exemplary structure of FIG. 7A. The vertical cross-sectional plane A-A' is the plane of the vertical cross-section of FIG. 7A. Referring to FIGS. 7A and 7B, a photoresist layer (not shown) may be applied over the nonvolatile memory material layer 60L, and may be lithographically patterned to form a two-dimensional array of discrete photoresist material portions. The patterned photoresist material portions may be laterally offset from the gate electrodes 52. In one embodiment, at least one pair of patterned photoresist material portions that are laterally spaced apart along the first horizontal direction hd1 may be provided between each neighboring pair of gate electrodes 52. In one embodiment, multiple pairs of patterned photoresist material portions may be formed between each neighboring pair of gate electrodes 52 such that pairs of patterned photoresist material portions are arranged along the second horizontal direction. For example, a 2×N rectangular array of patterned photoresist material portions may be formed over the area of each top electrode 40, in which N may be any positive integer.

An anisotropic etch process may be performed to transfer the pattern in the patterned photoresist material portions through the nonvolatile memory material layer 60L. Unmasked portions of the nonvolatile memory material layer 60L may be removed by the anisotropic etch process. Each remaining portion of the nonvolatile memory material layer 60L comprises a nonvolatile memory element 60. The photoresist layer may be subsequently removed, for example, by ashing.

Each nonvolatile memory element 60 may be formed on a top surface of a respective top electrode 40. Generally, the nonvolatile memory elements 60 may be formed by depositing and patterning a nonvolatile memory material, which may be selected from a phase change material, a vacancy modulated conductive oxide material, and a ferroelectric memory material. Each top electrode 40 may contact at least one nonvolatile memory element 60, and may contact an array of nonvolatile memory elements 60.

FIG. 8A is a vertical cross-sectional view of an exemplary structure after formation of a memory-level dielectric layer according to an embodiment of the present disclosure. FIG. 8B is a top-down view of the exemplary structure of FIG. 8A. The vertical cross-sectional plane A-A' is the plane of the vertical cross-section of FIG. 8A. Referring to FIGS. 8A and 8B, a memory-level dielectric layer 70 may be deposited over the top electrodes 40 and the nonvolatile memory elements 60. The memory-level dielectric layer 70 includes a dielectric material such as undoped silicate glass, a doped silicate glass, or organosilicate glass. Other suitable materials for use as the memory-level dielectric layer 70 are within the contemplated scope of disclosure. The thickness of the memory-level dielectric layer 70 may be greater than the thickness of the nonvolatile memory elements 60, and may be in a range from 50 nm to 300 nm, although lesser and greater thicknesses may also be used. The memory-level dielectric layer 70 laterally surrounds the nonvolatile memory elements 60.

FIG. 9A is a vertical cross-sectional view of an exemplary structure after formation of a dielectric isolation structure according to an embodiment of the present disclosure. FIG. 9B is a top-down view of the exemplary structure of FIG. 9A. The vertical cross-sectional plane A-A' is the plane of the vertical cross-section of FIG. 9A. FIG. 9C is a horizontal cross-sectional view along the horizontal plane C-C' of the exemplary structure of FIG. 9A. The vertical cross-sectional plane A-A' is the plane of the vertical cross-section of FIG. 9A. Referring to FIGS. 9A-9C, a photoresist layer (not shown) may be applied over the memory-level dielectric layer 70, and may be lithographically patterned to form discrete opening therethrough. In one embodiment, the pattern of the openings through the photoresist layer may be selected such that each opening through the photoresist layer overlies a pair of nonvolatile memory elements 60 and a pair of via portions of a respective bottom electrode 20. In one embodiment, the pattern of the openings through the photoresist layer may be a two-dimensional periodic rectangular openings having a pitch along the first horizontal direction hd1 that is the same as the pitch of the gate electrodes 52 along the first horizontal direction hd1, and having a pitch along the second horizontal direction hd2 that is the same as the pitch of the via portions of the bottom electrodes 20 along the second horizontal direction hd2. In one embodiment, the patterned portions of the photoresist layer may have a shape of rectangular frames including a two-dimensional periodic array of rectangular openings therethrough.

An anisotropic etch process may be performed to transfer the pattern in the photoresist layer through the gate structures (50, 52) and the vertical stacks of a respective bottom electrode 20, a metal oxide semiconductor channel layer 30, a top electrode 40. Mutually intersecting line trenches may be formed through the gate structures (50, 52) and the vertical stacks (20, 30, 40). In such an embodiment, a top electrode 40 contacts a plurality of nonvolatile memory elements 60, each vertical stack of a bottom electrode 20, a metal oxide semiconductor channel layer 30, a top electrode 40 may be divided into a plurality of vertical stacks of a respective bottom electrode 20, a respective metal oxide semiconductor channel layer 30, a respective top electrode 40 upon formation of the line trenches. A two-dimensional rectangular array of vertical stacks of a respective bottom electrode 20, a respective metal oxide semiconductor channel layer 30, and a respective top electrode 40 may be formed. Each gate structure (50, 52) may be divided into an array of gate structures (50, 52) that are arranged along the second horizontal direction by the line trenches. The photoresist layer may be subsequently removed, for example, by ashing.

A dielectric fill material such as undoped silicate glass or a doped silicate glass may be deposited in the intersecting network of line trenches that laterally separate the vertical stacks of a respective bottom electrode 20, a respective metal oxide semiconductor channel layer 30, and a respective top electrode 40. Portions of the deposited dielectric fill material that fill the line trenches collectively constitute a dielectric isolation structure 72, which may be an intersecting network of dielectric material rails that laterally extend along the first horizontal direction hd1 or along the second horizontal direction hd2. Portions of the dielectric fill material that are deposited over the horizontal plane including the top surfaces of the memory-level dielectric layer 70 may, or may not, be removed. In one embodiment, the portions of the dielectric fill material that are deposited over the horizontal plane including the top surfaces of the memory-level dielectric layer 70 may be removed by a recess etch process.

Generally, the dielectric isolation structure 72 vertically extends through levels of the vertical stacks of a respective bottom electrode 20, a respective metal oxide semiconductor channel layer 30, and a respective top electrode 40. The dielectric isolation structure 72 may laterally enclose each combination of a first vertical stack (20, 30, 40), a gate structure (50, 52), and a second vertical stack (20, 30, 40).

A two-dimensional array of selector devices in a series connection with a respective nonvolatile memory element 60 may be provided. Each selector device includes a vertical stack (20, 30, 40) including, from bottom to top, a bottom electrode 20, a metal oxide semiconductor channel layer 30, and a top electrode 40 and located over a substrate 700; a gate dielectric layer 50 contacting sidewalls of the bottom electrode 20, the metal oxide semiconductor channel layer 30, and the top electrode 40; and a gate electrode 52 formed within the gate dielectric layer 50 and having a top surface that is coplanar with a top surface of the top electrode 40. In one embodiment, each bottom electrode 20 comprises a plate portion overlying the via-level dielectric layer 12 and contacting the gate dielectric layer 50 of a respective selector device, and a via portion formed within the via-level dielectric layer 12 and adjoined to the plate portion.

In one embodiment, each gate structure (50, 52) may laterally contact a respective pair of vertical stacks (20, 30, 40) of a respective bottom electrode 20, a respective metal oxide semiconductor channel layer 30, and a respective top electrode 40 within the array of selector devices. A pair of selector devices may share a gate structure (50, 52). For example, a first selector device (20, 30, 40, 50, 52) and a second selector device (20, 30, 40, 50, 52) may include two vertical stacks of a respective bottom electrode 20, a respective metal oxide semiconductor channel layer 30, and a respective top electrode 40, and the gate dielectric layer 50 of the first selector device (20, 30, 40, 50, 52) and the gate dielectric layer 50 of the second selector device (20, 30, 40, 50, 52) may comprise a single gate dielectric layer 50 that is shared between the first selector device (20, 30, 40, 50, 52) and the second selector device (20, 30, 40, 50, 52). Further, the gate electrode 52 of the first selector device (20, 30, 40, 50, 52) and the gate electrode 52 of the second selector device (20, 30, 40, 50, 52) may comprise a single gate electrode 52 that is shared between the first selector device (20, 30, 40, 50, 52) and the second selector device (20, 30, 40, 50, 52).

In one embodiment, each gate dielectric layer 50 may include a horizontal portion contacting a bottom surface of a gate electrode 52, and a pair of vertically extending portions adjoined to a periphery of the horizontal portion. One of the pair of vertically extending portions contacts the sidewalls of the bottom electrode 20, the metal oxide semiconductor channel layer 30, and the top electrode 40 of a first selector device (20, 30, 40, 50, 52), and the other of the pair of vertically extending portions contacts the sidewalls of the bottom electrode 20, the metal oxide semiconductor channel layer 30, and the top electrode 40 of a second selector device (20, 30, 40, 50, 52). The dielectric isolation structure 72 may contact sidewalls of each bottom electrode 20, each metal oxide semiconductor channel layer 30, and each top electrode 40 that do not contact a respective gate dielectric layer 50. The dielectric isolation structure 72 may contact sidewalls of the via-level dielectric layer 12.

FIG. 10A is a vertical cross-sectional view of an exemplary structure after recessing the memory-level dielectric layer and the dielectric isolation structure according to an embodiment of the present disclosure. FIG. 10B is a top-down view of the exemplary structure of FIG. 10A. The vertical cross-sectional plane A-A' is the plane of the vertical cross-section of FIG. 10A. Referring to FIGS. 10A and 10B, the memory-level dielectric layer 70 and the dielectric isolation structure 72 may be vertically recessed. For example, a recess etch process or a chemical mechanical planarization (CMP) process may be used to vertically recess the memory-level dielectric layer 70 and the dielectric isolation structure 72. The recess depth may be controlled such that top surfaces of the nonvolatile memory elements 60 are physically exposed. If a recess etch process is used to recess the memory-level dielectric layer 70 and the dielectric isolation structure 72, the nonvolatile memory elements 60 may be used for endpoint detection during the recess etch process. If a chemical mechanical planarization process is used to recess the memory-level dielectric layer 70 and the dielectric isolation structure 72, a sacrificial stopping layer (not shown) may be used, which may be deposited over the nonvolatile memory material layer 60L at the processing steps of FIGS. 6A and 6B, and may be removed at a terminal step of the chemical mechanical planarization process.

FIG. 11A is a vertical cross-sectional view of an exemplary structure after formation of bit lines according to an embodiment of the present disclosure. FIG. 11B is a top-down view of the exemplary structure of FIG. 11A. The vertical cross-sectional plane A-A' is the plane of the vertical cross-section of FIG. 11A. Referring to FIGS. 11A and 11B, bit lines 80 that laterally extend along the first horizontal direction hd1 may be formed on top surfaces of the nonvolatile memory elements 60 and over a top surface of the memory-level dielectric layer 70. Each bit line 80 may contact top surfaces of a respective column of nonvolatile memory elements 60 that are arranged along the first horizontal direction hd1. Each nonvolatile memory element 60 may be contacted by a respective bit line 80. In one embodiment, the bit lines 80 may be formed by depositing and patterning a metal layer into line structures. Alternatively, the bit lines 80 may be formed using a damascene process. In this embodiment, a bit-line-level dielectric layer (not shown) may be formed over the memory-level dielectric layer 70, line trenches may be formed through the bit-line-level dielectric layer over each column of nonvolatile memory elements 60 that are arranged along the first horizontal direction hd1, and bit lines 80 may be formed on top surfaces of a respective column of nonvolatile memory elements 60.

Figure 12C:
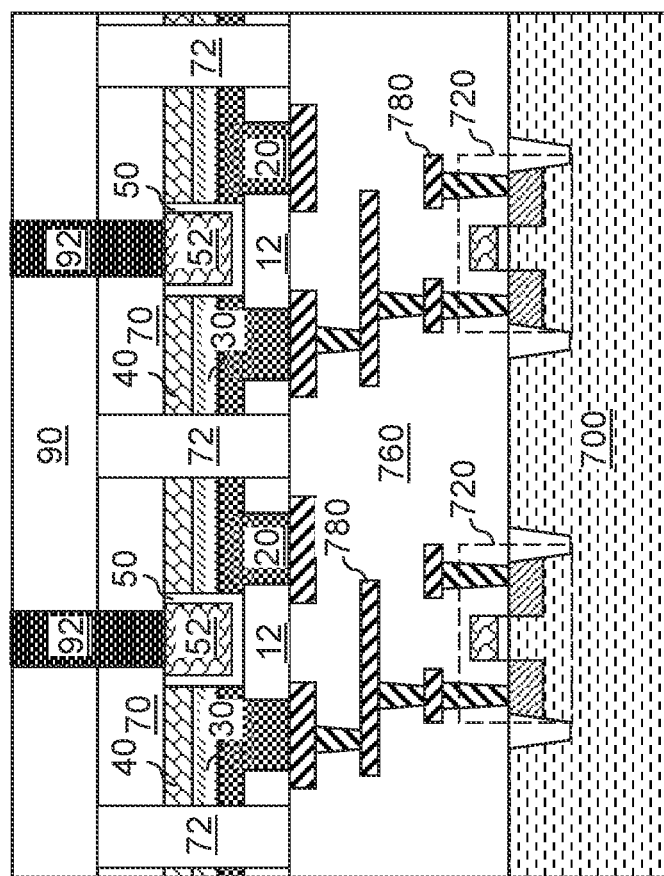
FIG. 12C is a vertical cross-sectional view of the exemplary structure along the vertical plane C-C' of FIG. 12B.

FIG. 12A is a vertical cross-sectional view of an exemplary structure after formation of a contact-level dielectric layer and gate electrode contact via structures according to an embodiment of the present disclosure. FIG. 12B is a top-down view of the exemplary structure of FIG. 12A. The vertical cross-sectional plane A-A' is the plane of the vertical cross-section of FIG. 12A. FIG. 12C is a vertical cross-sectional view of the exemplary structure along the vertical plane C-C' of FIG. 12B. Referring to FIGS. 12A-12C, a contact-level dielectric layer 90 may be formed over the bit lines 80, and/or around the bit lines 80. In such embodiments, the bit lines 80 are formed using a damascene process, the contact-level dielectric layer 90 may incorporate, and/or may be the same as, the bit-line-level dielectric layer. The top surface of the contact-level dielectric layer 90 may have a top surface within, or above, a horizontal plane including top surfaces of the bit lines 80.

Gate electrode contact via structures 92 may be formed through the contact-level dielectric layer 90 and the memory-level dielectric layer 70 on a top surface of a respective gate electrode 52. Each gate electrode 52 may be contacted by a respective gate electrode contact via structure 92. For example, a photoresist layer (not shown) may be applied over the contact-level dielectric layer 90, and may be lithographically patterned to form a two-dimensional array of openings in areas that overlie the gate electrodes 52. An anisotropic etch process may be performed to form via cavities extending through the contact-level dielectric layer 90 and the memory-level dielectric layer 70 and down to a top surface of a respective gate electrode 52. The photoresist layer may be removed, for example, by ashing. At least one conductive material may be deposited in the via cavities to form the gate electrode contact via structures 92. Excess portions of the at least one conductive material may be removed from above the top surface of the contact-level dielectric layer 90 by a planarization process, which may use a recess etch process and/or a chemical mechanical planarization process.

Figure 13A:
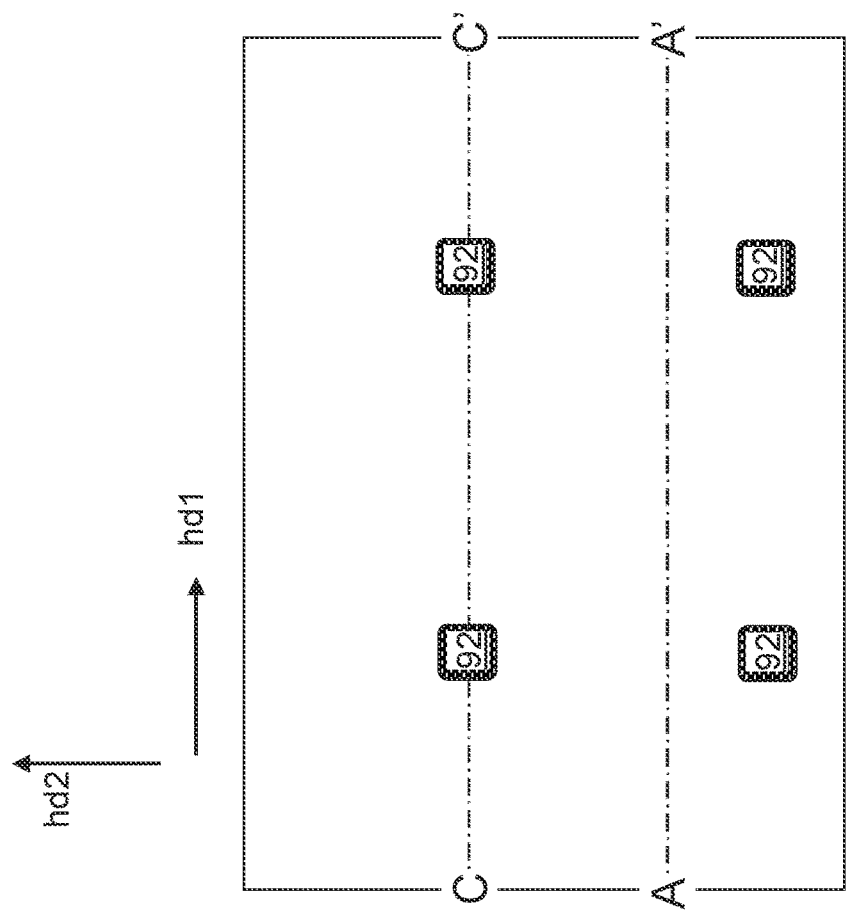
FIG. 13A is a vertical cross-sectional view of an alternative configuration of the exemplary structure according to an embodiment of the present disclosure.
Figure 13B:
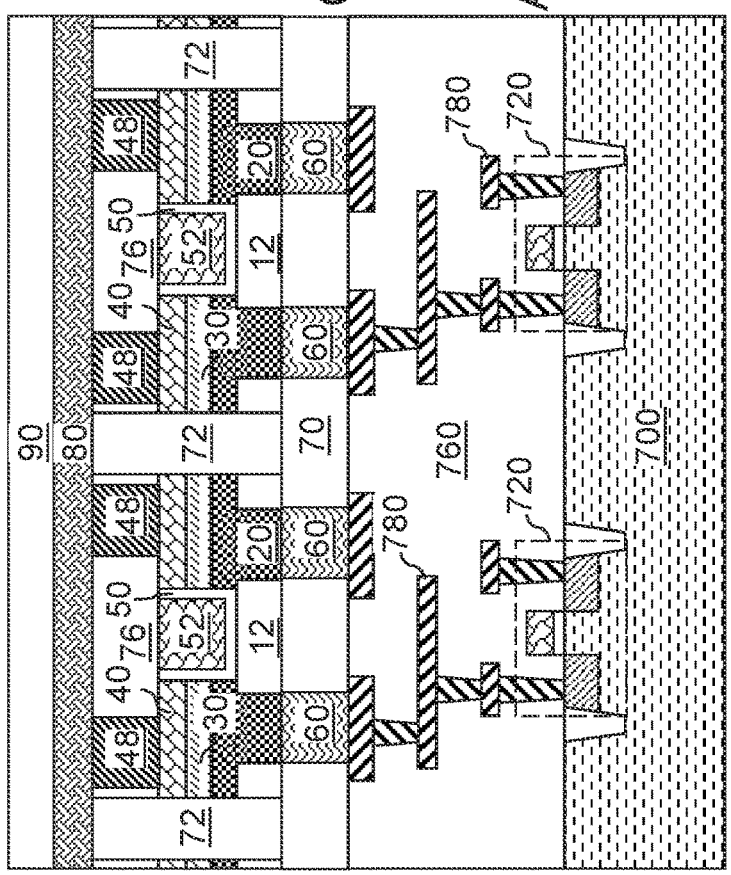
FIG. 13B is a top-down view of the alternative configuration of the exemplary structure of FIG. 13A. The vertical cross-sectional plane A-A' is the plane of the vertical cross-section of FIG. 13A.
Figure 13C:
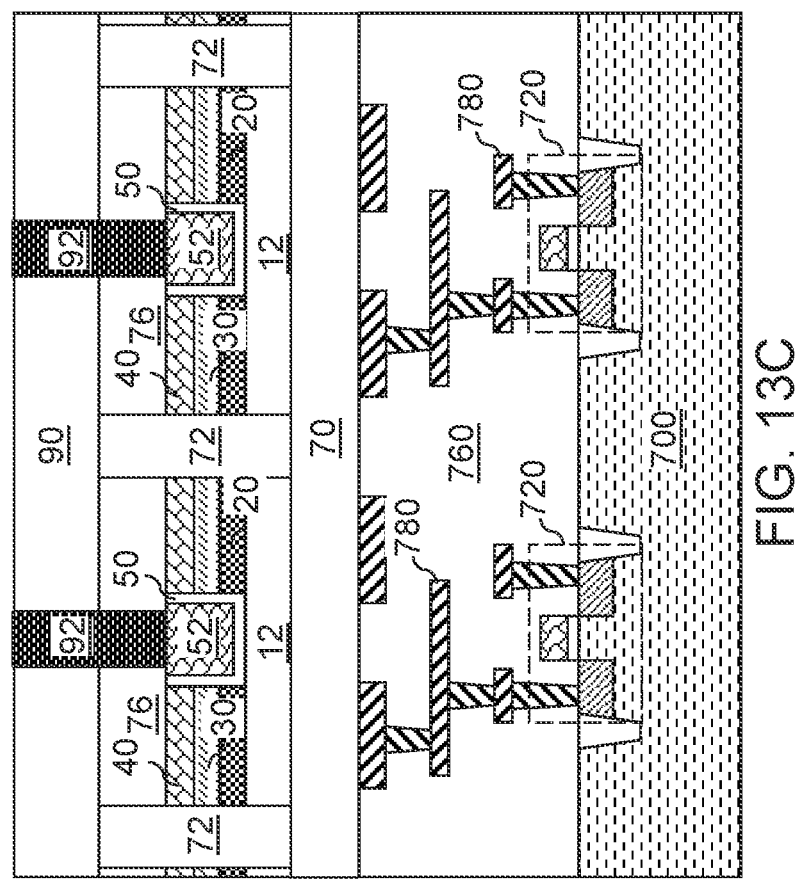
FIG. 13C is a vertical cross-sectional view of the alternative configuration of the exemplary structure along the vertical plane C-C' of FIG. 13B.

FIG. 13A is a vertical cross-sectional view of an alternative configuration of the exemplary structure according to an embodiment of the present disclosure. FIG. 13B is a top-down view of the alternative configuration of the exemplary structure of FIG. 13A. The vertical cross-sectional plane A-A' is the plane of the vertical cross-section of FIG. 13A. FIG. 13C is a vertical cross-sectional view of the alternative configuration of the exemplary structure along the vertical plane C-C' of FIG. 13B. Referring to FIGS. 13A-13C, an alternative configuration of the exemplary structure is illustrated, which may be derived from the exemplary structure of FIGS. 12A-12C by forming a memory-level dielectric layer 70 having formed therein a two-dimensional array of nonvolatile memory elements 60 over dielectric material layers 760 having formed therein metal interconnect structures 780. Subsequently the processing steps of FIGS. 1A-6B may be performed with a modification in the pattern of bottom-electrode-level via cavities 19 such that the via portion of each bottom electrode 20 is formed on a top surface of a respective nonvolatile memory element 60. Subsequently, a connection-level dielectric layer 76 may be formed over a two-dimensional array of vertical stacks of a respective bottom electrode 20, a respective metal oxide semiconductor channel layer 30, and a respective top electrode 40. Top-electrode-contact via structures 48 may be formed through the connection-level dielectric layer 76 on a top surface of a respective one of the top electrodes 40. Subsequently, the processing steps of FIGS. 11A and 11B may be performed with a modification such that each bit line 80 is formed on a respective column of top-electrode-contact via structures 48. The processing steps of FIGS. 12A-12C may be subsequently performed to form gate electrode contact via structures 92 contacting a respective one of the gate electrodes 52.

Referring to FIGS. 1A-13C and according to various embodiments of the present disclosure, a device structure comprising at least one selector device (20, 30, 40, 50, 52) is provided. Each of the at least one selector device (20, 30, 40, 50, 52) comprises: a vertical stack including, from bottom to top, a bottom electrode 20, a metal oxide semiconductor channel layer 30, and a top electrode 40 and located over a substrate 700; a gate dielectric layer 50 contacting sidewalls of the bottom electrode 20, the metal oxide semiconductor channel layer 30, and the top electrode 40; and a gate electrode 52 formed within the gate dielectric layer 50 and having a top surface that is coplanar with a top surface of the top electrode 40.

In one embodiment, the gate dielectric layer 50 comprises a horizontal portion contacting a bottom surface of the gate electrode 52, and a pair of vertically extending portions adjoined to a periphery of the horizontal portion. One of the pair of vertically extending portions contacts the sidewalls of the bottom electrode 20, the metal oxide semiconductor channel layer 30, and the top electrode 40.

In one embodiment, each top electrode 40 (as illustrated in FIGS. 12A-12C) or each bottom electrode (as illustrated in FIGS. 13A-13C) of the at least one selector device (20, 30, 40, 50, 52) is contacted by a respective nonvolatile memory element 60. In one embodiment, the respective nonvolatile memory element 60 comprises a material selected from a phase change material, a vacancy modulated conductive oxide material, and a ferroelectric memory material. In one embodiment, each nonvolatile memory element 60 is contacted by a respective bit line 80 that laterally extends along a horizontal direction as illustrated in FIGS. 12A-12C. In one embodiment, each gate electrode 52 is contacted by a respective gate electrode contact via structure 92.

In one embodiment, the at least one selector device comprises a first selector device (20, 30, 40, 50, 52) and a second selector device (20, 30, 40, 50, 52) that include two vertical stacks of a respective bottom electrode 20, a respective metal oxide semiconductor channel layer 30, and a respective top electrode 40. The gate dielectric layer 50 of the first selector device (20, 30, 40, 50, 52) and the gate dielectric layer 50 of the second selector device (20, 30, 40, 50, 52) may comprise a single gate dielectric layer 50 that is shared between the first selector device (20, 30, 40, 50, 52) and the second selector device (20, 30, 40, 50, 52). The gate electrode 52 of the first selector device (20, 30, 40, 50, 52) and the gate electrode 52 of the second selector device (20, 30, 40, 50, 52) may comprise a single gate electrode 52 that is shared between the first selector device (20, 30, 40, 50, 52) and the second selector device (20, 30, 40, 50, 52).

In one embodiment, the device structure comprises a via-level dielectric layer 12 underlying the gate dielectric layer 50; and each bottom electrode 20 comprises a plate portion overlying the via-level dielectric layer 12 and contacting the gate dielectric layer 50 of a respective selector device (20, 30, 40, 50, 52), and a via portion formed within the via-level dielectric layer 12 and adjoined to the plate portion. In one embodiment, the device structure comprises a dielectric isolation structure 72 contacting additional sidewalls of the bottom electrode 20, the metal oxide semiconductor channel layer 30, and the top electrode 40, and contacting a sidewall of the via-level dielectric layer 12.

In one embodiment, the device structure comprises: field effect transistors located on top of the substrate 700; and metal interconnect structures 780 formed within dielectric material layers 760. A subset of the metal interconnect structures 780 is electrically connected to electrical nodes of the field effect transistors and to a bottom electrode 20 or a top electrode 40 of the at least one selector device. In such an embodiment, the subset of the metal interconnect structures 780 is electrically connected to the top electrode 40 of the at least one selector device (20, 30, 40, 50, 52), the subset of the metal interconnect structures 780 may be connected to the bit lines 80 instead of the bottom electrodes 20.

According to another aspect of the present disclosure, a memory array is provided, which comprises an array of selector devices (20, 30, 40, 50, 52). Each selector device (20, 30, 40, 50, 52) within the array of selector devices (20, 30, 40, 50, 52) comprises a vertical stack that includes, from bottom to top, a bottom electrode 20, a metal oxide semiconductor channel layer 30, and a top electrode 40 and located over a substrate 700, and is laterally contacted by a respective a gate structure (50, 52) including a respective gate dielectric layer 50 and a respective gate electrode 52. Each selector device (20, 30, 40, 50, 52) within the array of selector devices (20, 30, 40, 50, 52) contacts a nonvolatile memory element 60. Each nonvolatile memory element 60 within the array of nonvolatile memory elements 60 contacts a horizontal surface of a top electrode 40 or a bottom electrode 20 of a respective selector device (20, 30, 40, 50, 52) within the array of selector devices (20, 30, 40, 50, 52).

In one embodiment, each gate structure (50, 52) laterally contacts a respective pair of vertical stacks (20, 30, 40) within the array of selector devices (20, 30, 40, 50, 52). In one embodiment, a dielectric isolation structure 72 may vertically extend through levels of the vertical stacks (20, 30, 40) and laterally encloses each combination of a first vertical stack (20, 30, 40), a gate structure (50, 52), and a second vertical stack (20, 30, 40).

In one embodiment, the memory array comprises bit lines 80 contacting a respective column of nonvolatile memory elements 60 selected from the array of nonvolatile memory elements 60. In one embodiment, the memory device comprises field effect transistors located on top of the substrate 700 and comprising a programming circuit and a sensing circuit for the array of nonvolatile memory elements 60, and metal interconnect structures 780 formed within dielectric material layers 760 and electrically connected to electrical nodes of the field effect transistors and to bottom electrodes 20 or top electrodes 40 of the array of selector devices (20, 30, 40, 50, 52).

Figure 14:
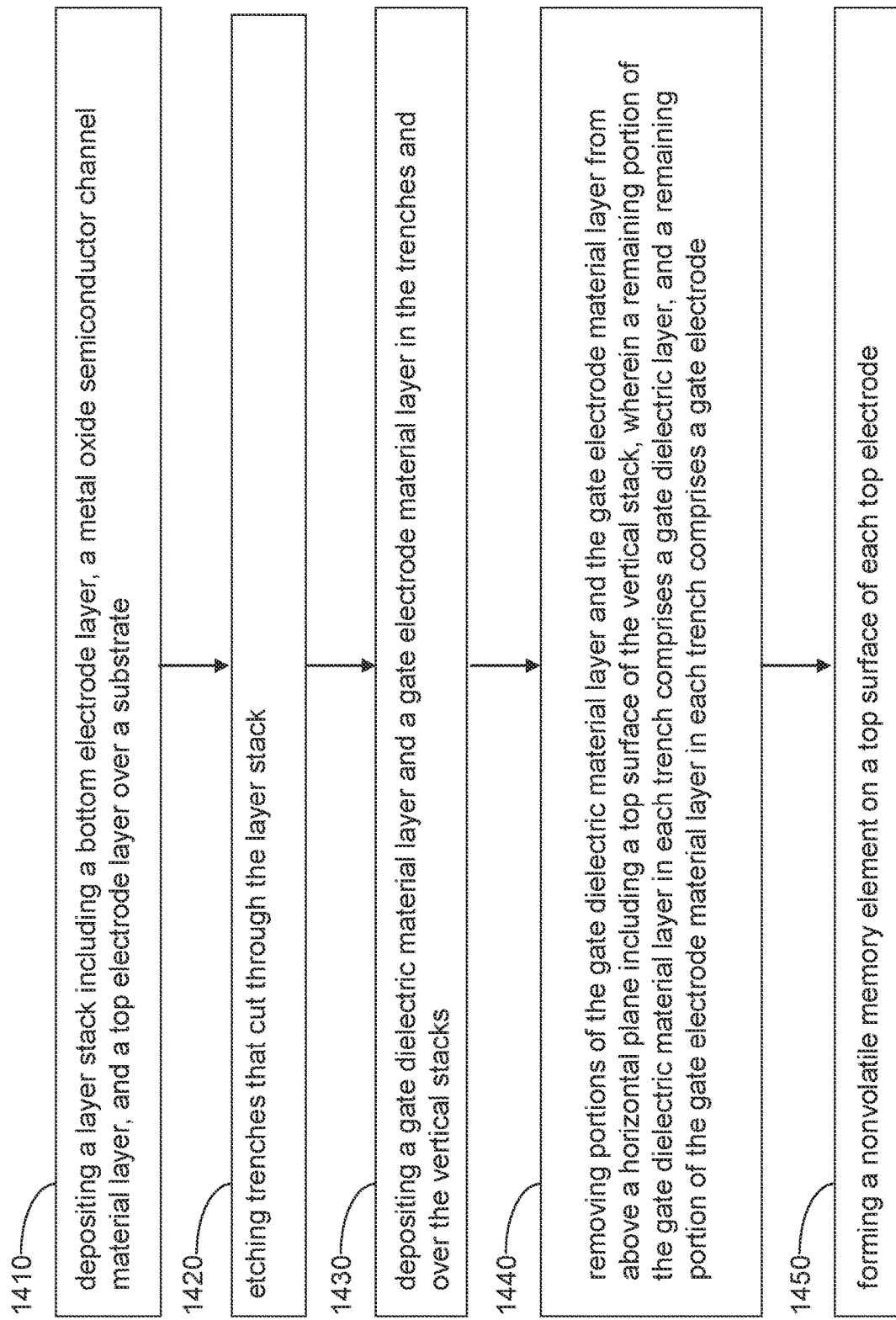
FIG. 14 is a first flowchart illustrating steps for forming the exemplary structure of the present disclosure according to an embodiment of the present disclosure.

Referring to FIG. 14, a first flowchart illustrates processing steps for forming a device structure of the present disclosure. Referring to step 1410 and FIGS. 1A-2B, a layer stack including a bottom electrode layer 20L, a metal oxide semiconductor channel material layer 30L, and a top electrode layer 40L may be deposited over a substrate 700. Referring to step 1420 and FIGS. 3A and 3B, trenches (such as line trenches 51) that cut through the layer stack may be etched. Vertical stacks (20, 30, 40) of a respective bottom electrode 20, a respective metal oxide semiconductor channel layer 30, and a respective top electrode 40 may be formed. Referring to step 1430 and FIGS. 4A and 4B, a gate dielectric material layer 50L and a gate electrode material layer 52L may be deposited in the trenches and over the vertical stacks (20, 30, 40). Referring to step 1440 and FIGS. 5A and 5B, portions of the gate dielectric material layer 50L and the gate electrode material layer 52L may be removed from above a horizontal plane including top surfaces of the vertical stacks (20, 30, 40). Each remaining portion of the gate dielectric material layer 50L in the trenches comprises a gate dielectric layer 50, and each remaining portion of the gate electrode material layer 52L in the trenches comprises a gate electrode 52. Referring to step 1450 and FIGS. 6A-7B, a nonvolatile memory element 60 may be formed on a top surface of each top electrode 40. Subsequently, the processing steps of FIGS. 8A-12C may be optionally performed to provide electrical wiring to the device structure. Alternatively, an array of nonvolatile memory elements 60 may be formed first, and an array of selector devices (20, 30, 40, 50, 52) may be formed thereupon.

The various embodiments of the present disclosure may be used to provide a cross-point array of unit device structures, each including a series connection of a nonvolatile memory element 60 and a selector device (20, 30, 40, 50, 52). Each selector device (20, 30, 40, 50, 52) includes a vertical field effect transistor using a metal oxide semiconductor channel, which may provide a high on-off current ratio, and effectively suppress leakage current through unselected nonvolatile memory elements 60. Thus, high signal-to-noise ratio and integration of a large number of memory elements may be achieved by using the devices of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device structure, comprising:
   depositing a layer stack including a bottom electrode layer, a metal oxide semiconductor channel material layer, and a top electrode layer over a substrate;
   etching trenches that cut through the layer stack, wherein vertical stacks of a respective bottom electrode, a respective metal oxide semiconductor channel layer, and a respective top electrode are formed;

depositing a gate dielectric material layer and a gate electrode material layer in the trenches and over the vertical stacks; and removing portions of the gate dielectric material layer and the gate electrode material layer from above a horizontal plane including top surfaces of the vertical stacks, wherein each remaining portion of the gate dielectric material layer in the trenches comprises a gate dielectric layer, and each remaining portion of the gate electrode material layer in the trenches comprises a gate electrode, wherein top surfaces of the gate electrodes are formed within a same horizontal plane as top surfaces of the top electrodes within the vertical stacks.

2. The method of claim 1, further comprising forming a nonvolatile memory element on a top surface of each top electrode.

3. The method of claim 2, wherein the nonvolatile memory elements are formed by depositing and patterning a material selected from a phase change material, a vacancy modulated conductive oxide material, and a ferroelectric memory material.

4. The method of claim 2, wherein further comprising:
forming a memory-level dielectric layer that laterally surrounds the nonvolatile memory elements; and
forming bit lines that laterally extends along a horizontal direction on a top surface of a respective subset of the nonvolatile memory element over a top surface of the memory-level dielectric layer.

5. The method of claim 4, further comprising forming gate electrode contact via structures through the memory-level dielectric layer on a top surface of a respective gate electrode.

6. The method of claim 1, further comprising:
forming field effect transistors on top of the substrate; and
forming metal interconnect structures embedded within dielectric material layers over the field effect transistors, wherein the layer stack is formed over the metal interconnect structures.

7. The method of claim 6, wherein a subset of the metal interconnect structures is electrically connected to electrical nodes of the field effect transistors, and to the bottom electrodes or to the top electrodes.

8. The method of claim 6, further comprising:
forming a via-level dielectric layer over the metal interconnect structures; and
forming openings in the via-level dielectric layer, wherein a top surface of a respective one of the metal interconnect structures is exposed underneath the openings, and wherein the bottom electrode layer fills the openings in the via-level dielectric layer.

9. The method of claim 8, wherein each of the bottom electrodes comprises a via portion that is formed within a respective one of the openings in the via-level dielectric layer and contacting a top surface of a respective one of the metal interconnect structures.

10. The method of claim 1, further comprising:
forming a dielectric layer over the vertical stacks of the respective bottom electrode, the respective metal oxide semiconductor channel layer, and the respective top electrode; and
forming dielectric isolation structures through the vertical stacks, wherein each of the vertical stacks is divided into a plurality of devices including a respective vertical field effect transistor.

11. A method of forming a device structure, comprising:
forming dielectric material layers over a substrate;

forming a via-level dielectric layer over the dielectric material layers;

forming vertical stacks of a respective bottom electrode, a respective metal oxide semiconductor channel material layer, and a respective top electrode over the via-level dielectric layer; and forming a gate dielectric layers and gate electrodes on sidewalls of the vertical stacks, wherein:

each of the gate dielectric layers is formed on a sidewall of a respective one of the vertical stacks;

each of the gate electrodes is formed within a volume that is laterally surrounded by a respective one of the gate dielectric layers; and top surfaces of the gate electrodes are formed within a same horizontal plane as top surfaces of the top electrodes within the vertical stacks.

12. The method of claim 11, further comprising:
forming metal interconnect structures over the substrate, wherein the metal interconnect structures are formed within the dielectric material layers; and
forming openings through the via-level dielectric layer, wherein each of the bottom electrodes comprises two rows of via portions formed within a respective subset of the openings through the via-level dielectric layer.

13. The method of claim 12, wherein:
the vertical stacks are laterally spaced apart along a first horizontal direction; and
the method comprises forming two rows of non-volatile memory elements over each of the vertical stacks, wherein each row of non-volatile memory elements is arranged along a second horizontal direction that is different from the first horizontal direction.

14. The method of claim 13, further comprising forming dielectric isolation structures through the vertical stacks, the gate dielectric layers, and the gate electrodes, wherein each of the vertical stacks is divided into two rows of patterned portions, wherein each of the patterned portions is contacted by a respective patterned portion of a respective gate electrode layer and a respective gate electrode.

15. The method of claim 14, further comprising a memory-level dielectric layer over the non-volatile memory elements, wherein:
the dielectric isolation structures are formed through the memory-level dielectric layer; and
each patterned portion of the top electrodes after formation of the dielectric isolation structures contacts a bottom surface of a respective non-volatile memory element.

16. A method of forming a device structure, comprising:
forming vertical stacks of a respective bottom electrode, a respective metal oxide semiconductor channel material layer, and a respective top electrode over the via-level dielectric layer over a substrate, wherein the vertical stacks are laterally spaced apart along a first horizontal direction;

forming gate dielectric layers and gate electrodes, wherein each of the gate dielectric layers is formed on a sidewall of a respective one of the vertical stacks, each of the gate electrodes is formed within a volume that is laterally surrounded by a respective one of the gate dielectric layers;

forming two rows of non-volatile memory elements over each of the vertical stacks, wherein each row of non-volatile memory elements is arranged along a second horizontal direction that is different from the first horizontal direction;

forming a memory-level dielectric layer over the non-volatile memory elements; and forming dielectric isolation structures through the vertical stacks, wherein each of the vertical stacks is divided into a respective pair of rows of series connections of a vertical field effect transistor and a non-volatile memory element, wherein the dielectric isolation structures cuts through each of the gate electrodes, wherein each of the gate electrodes is divided into multiple divided gate electrodes that are arranged along the second horizontal direction.

17. The method of claim 16, further comprising:
depositing a layer stack including a bottom electrode layer, a metal oxide semiconductor channel material layer, and a top electrode layer over the substrate; and
etching trenches that cut through the layer stack, patterned portions of the layer stack comprise the vertical stacks.

18. The method of claim 17, further comprising:
forming field effect transistors on top of the substrate; and
forming metal interconnect structures embedded within dielectric material layers over the field effect transistors, wherein the layer stack is formed over the metal interconnect structures, and wherein each of the top electrodes within the vertical stacks is formed directly on top surfaces of a respective row of metal interconnect structures among the metal interconnect structures.

19. The method of claim 16, wherein top surfaces of the gate electrodes are formed within a horizontal plane including top surfaces of the top electrodes.

20. The method of claim 1, further comprising:
forming a memory-level dielectric layer over the non-volatile memory elements; and
forming dielectric isolation structures through the vertical stacks, wherein each of the vertical stacks is divided into a respective pair of rows of vertical field effect transistor,
wherein:
the dielectric isolation structures cuts through each of the gate electrodes; and
each of the gate electrodes is divided into multiple divided gate electrodes.

* * * * *